(12) United States Patent
Habu et al.

(10) Patent No.: US 8,385,045 B2
(45) Date of Patent: Feb. 26, 2013

(54) VARIABLE CAPACITOR, CONTROL METHOD THEREOF, ELECTRONIC DEVICE AND COMMUNICATION MOBILE DEVICE

(75) Inventors: Kazutaka Habu, Tokyo (JP);
Masayoshi Kanno, Kanagawa (JP);
Toshiaki Yokota, Miyagi (JP); Makoto Watanabe, Miyagi (JP)

(73) Assignee: Sony Corporation, Tokyo (JP)

( * ) Notice: Subject to any disclaimer, the term of this patent is extended or adjusted under 35 U.S.C. 154(b) by 271 days.

(21) Appl. No.: 12/918,754

(22) PCT Filed: Feb. 12, 2009

(86) PCT No.: PCT/JP2009/052331
§ 371 (c)(1),
(2), (4) Date: Aug. 20, 2010

(87) PCT Pub. No.: WO2009/107488
PCT Pub. Date: Sep. 3, 2009

(65) Prior Publication Data
US 2010/0321857 A1    Dec. 23, 2010

(30) Foreign Application Priority Data

Feb. 29, 2008  (JP) .................................. 2008-051363

(51) Int. Cl.
*H01G 7/00* (2006.01)
(52) U.S. Cl. ..... 361/281; 361/277; 361/278; 361/283.1; 361/290; 361/292

(58) Field of Classification Search .................. 361/281, 361/272–273, 277–279, 280, 283.1, 283.2, 361/290–292, 283.3
See application file for complete search history.

(56) References Cited

U.S. PATENT DOCUMENTS

| | | | |
|---|---|---|---|
| 6,404,614 B1 * | 6/2002 | Zhu et al. ........................ | 361/277 |
| 7,030,463 B1 * | 4/2006 | Subramanyam et al. ...... | 257/595 |
| 7,274,277 B2 * | 9/2007 | Gevorgian et al. ............ | 333/235 |
| 7,990,749 B2 * | 8/2011 | Evans, Jr. ....................... | 365/145 |

FOREIGN PATENT DOCUMENTS

| | | |
|---|---|---|
| JP | 05-182857 | 7/1993 |
| JP | 10-223475 | 8/1998 |
| JP | 2000-101345 | 4/2000 |
| JP | 2005-286658 | 10/2005 |

OTHER PUBLICATIONS

International Search Report dated May 26, 2009.

* cited by examiner

*Primary Examiner* — Nguyen T Ha
(74) *Attorney, Agent, or Firm* — SNR Denton US LLP

(57) ABSTRACT

A variable capacitor and a control method thereof capable of responding to applications of electronic apparatuses including various electronic devices and communication mobile devices. The variable capacitor includes a pair of electrodes formed so as to sandwich a ferroelectric material layer, in which polarization processing higher than a coercive field in hysteresis characteristics of polarization has been performed to the ferroelectric material layer, and the capacitance can be varied in accordance with a control voltage applied to the electrodes.

12 Claims, 15 Drawing Sheets

FIG. 17 – PRIOR ART
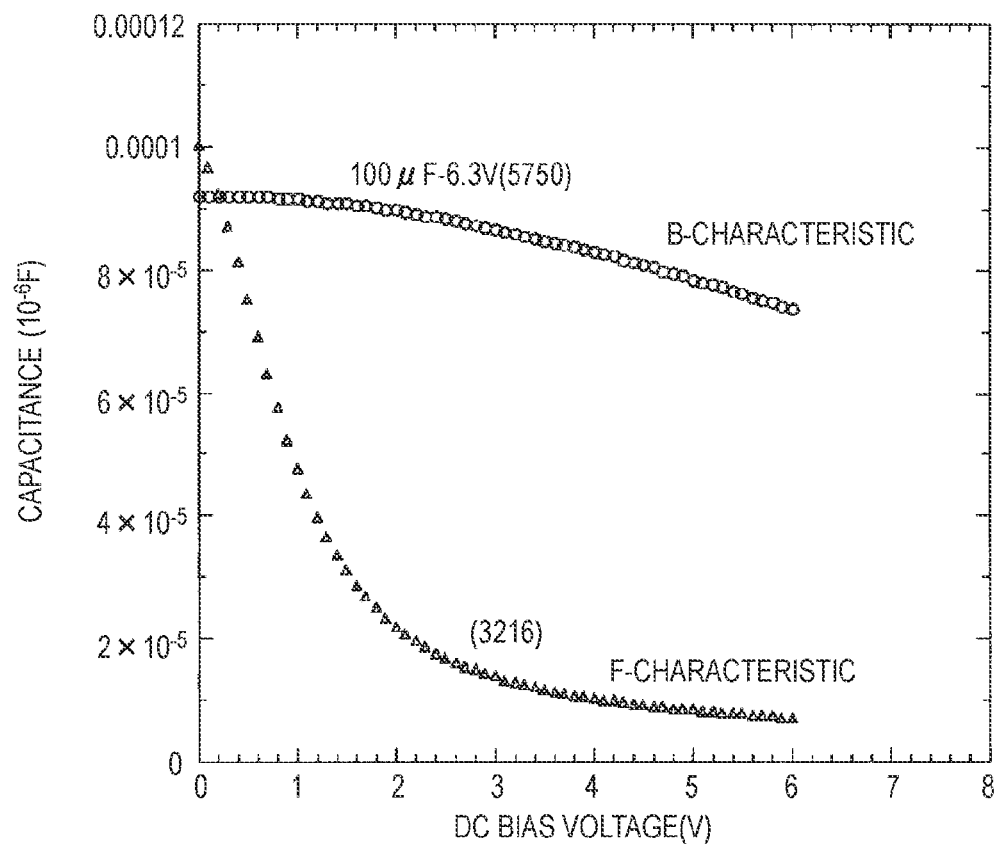

FIG. 18 – PRIOR ART
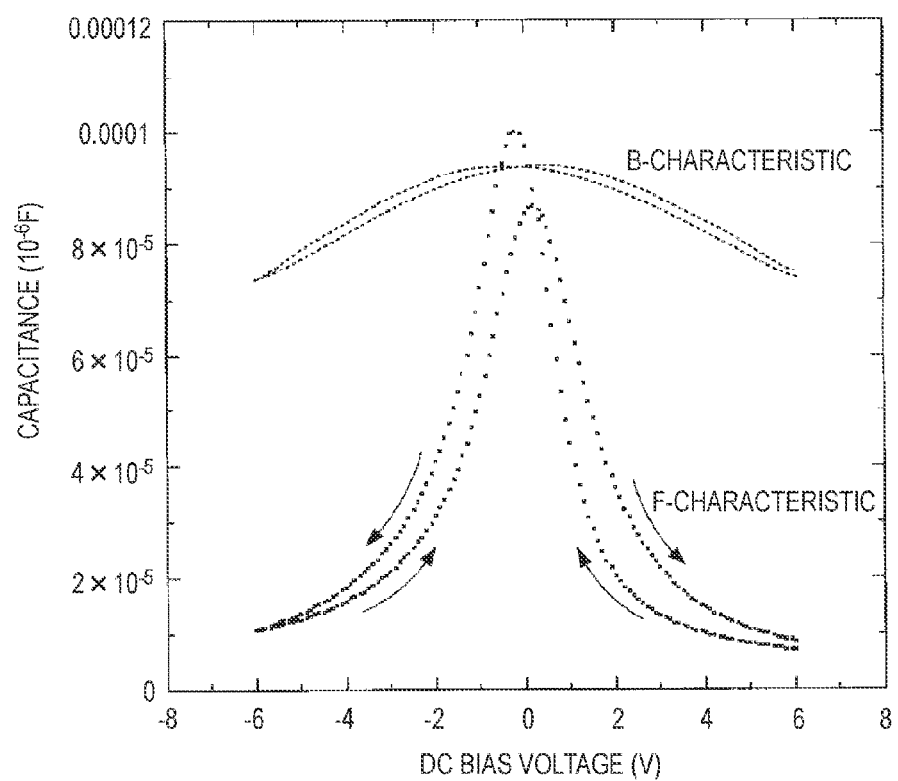

VARIABLE CAPACITOR, CONTROL METHOD THEREOF, ELECTRONIC DEVICE AND COMMUNICATION MOBILE DEVICE

TECHNICAL FIELD

The present invention relates to a variable capacitor, a control method thereof, an electronic device and a communication mobile device in which the variable capacitor is built.

BACKGROUND ART

In recent years, electronic apparatus represented by Information Technology (IT) have been widely popularized due to development of digital technology, and energy consumption caused by the popularization becomes controversial. In the above information technology, communication technology between mobile devices by communication has also progressed.

Generally, a power supply circuit system of a series regulator using a power transformer is used in simple stationary electronic devices. In the power supply system, 100V of commercial power is divided to be fallen and rectified in a diode bridge circuit, then, a waveform is smoothed by a large-capacity capacitor and voltage variation is absorbed and voltage is stabilized by a regulator which is a semiconductor component in order to stabilize variation of external AC voltage, variation of electronic components and output variation.

However, absorption of voltage variation by the regulator has an adverse effect on environmental concerns because the variation amount is discharged as excess Joule heat. The present inventors have proposed a method of reducing discharge of excess Joule heat by using a variable capacitor as described later.

FIG. 17 shows characteristics of a ceramic capacitor in related art, namely, DC bias voltage dependence of capacitance. The ceramic capacitor is typified by two types when broadly divided, which are a B-characteristic capacitor having small capacitance variation with respect to the DC bias voltage as control voltage and an F-characteristic capacitor having large capacitance variation with respect to the DC bias voltage. The F-characteristic shown in FIG. 17 is a use characteristic having capacitance variation of +30 to −80% in the use temperature range of −25° C. to 85° C. The B-characteristic is a use characteristic having capacitance variation of ±10% in the use temperature range of −25° C. to 85° C. As it is desirable that capacitance does not vary as a commonly used capacitor, the B-characteristic capacitor having small capacitance variation is used.

The above capacitors are made of ferroelectric materials of a type of barium titanate ($BaTiO_3$) in which capacitance variation occurs by the DC bias voltage. It is considered that the phenomenon in which capacitance varies by the external voltage occurs by polarization charge caused by capacitor capacitance and the behavior of a polarization domain acting on an electric field. The capacitance variation can be increased by increasing the capacitance by changing the Curie point or by changing the grain size according to additive elements and sintering conditions (see Non-Patent Document 1) in this type of materials. However, it is not preferable because the capacitance varies by adding voltage in general use of the capacitor.

To use the type of barium titanate and lead zirconate titanate (PZT) as the ferroelectric materials for the capacitor is disclosed in Patent Documents 1, 2 and the like.

Patent Document 1: JP-A-10-223475
Patent Document 2: JP-A-2000-101345

Non-Patent Document 1: Landolt-Bornstein Vol. 16, Ferroelectrics and Related Substances (1981)

DISCLOSURE OF THE INVENTION

Problems that the Invention is to Solve

The above method in the power supply circuit proposed by the present inventors is the method in which voltage reduction corresponding to voltage variation is controlled through the variable capacitor to reduce generation of Joule heat in order to further reduce discharge of excess Joule heat. The method utilizes a principle in which power loss is not generated because a current phase and a voltage phase are not aligned concerning an imaginary part of alternating current in voltage reduction by the capacitor. The variable capacitor used in such power supply circuit is desirable because large power loss corresponding to large voltage variation can be suppressed as capacitance and the capacitance variation become larger.

The capacitance variation of ferroelectric-type materials is characterized by having hysteresis characteristics according to the magnitude of DC bias voltage and the polarity of the applied voltage because of the ferroelectric materials. The type of barium titanate materials to which polarization processing has not been performed has capacitance variation represented by a curve having a peak of capacitance variation shifted from the origin (0V) of DC bias voltage and showing gradual reduction variation in areas exceeding the peak as shown in FIG. 18. Therefore, inconvenient occurs in the type of barium titanate materials, in which capacitance variation values are different even in the same DC bias voltage due to the reduction of the hysteresis characteristics when exceeding the peak of capacitance variation. For example, the capacitance differs according to the polarity and the magnitude of the DC bias voltage even in 0V at which the DC bias voltage is not applied. Accordingly, it is necessary to limit the use area to a small area of a monotone decreasing area or to make a circuit considering characteristics when exceeding the peak. Even when limited to the monotone decreasing area, linearity is reduced in capacitance variation, therefore, circuit design was troublesome. Additionally, to use characteristics of capacitance variation of negative polarity with respect to control voltage of positive polarity was troublesome in the circuit control in general.

On the other hand, increase of power consumption in the electric appliances and upgrade of communication by mobile devices have progressed in recent years, and saving of power consumption and highly functional tuning of frequencies of radio communication are requested. For the tuning of radio frequencies of devices by antenna communication of mobile devices, a varicap semiconductor is considered, however, there was problems such that it was difficult to obtain large capacitance and that withstand pressure is low as it is the semiconductor.

In view of the above, the present invention provides a variable capacitor and a control method thereof which can respond to applications of electronic apparatus such as for the power supply circuit and the mobile device.

The invention also provides an electronic device and a communication mobile device including the above variable capacitor.

Means for Solving the Problems

A variable capacitor according to the invention includes a pair of electrodes formed so as to sandwich a ferroelectric material layer, in which polarization processing higher than a coercive field in hysteresis characteristics of polarization has been performed to the ferroelectric material layer, and the capacitance is varied in accordance with a control voltage applied to the electrodes.

The capacitor according to the invention is configured to vary the capacitance in accordance with the control voltage by performing polarization processing higher than the coercive field to the ferroelectric material layer, thereby obtaining higher capacitance as well as obtaining capacitance variation having good linearity. When using the same control voltage, the fixed same capacitance variation value can be obtained.

A control method of a variable capacitor is a control method of a variable capacitor including a pair of electrodes formed so as to sandwich a ferroelectric material layer, in which polarization processing higher than a coercive field has been performed to the ferroelectric material layer, including a step of controlling a control voltage applied to the electrodes in a range of $\pm \Delta V$ by using 0V as the center to control the capacitance to be varied.

According to the control method of the variable capacitor of the invention, the capacitance is controlled to be varied in the range of $\pm \Delta V$ by using 0V as the center, therefore, the capacitance is constantly maintained to a desired value corresponding to 0V when voltage is not applied.

A control method of a variable capacitor is a control method of a variable capacitor including a pair of electrodes formed so as to sandwich a ferroelectric material layer, in which polarization processing higher than a coercive field in hysteresis characteristics of polarization has been performed to the ferroelectric material layer, including a step of switching a positive/negative polarity of a control voltage to be applied to the electrodes to vary the capacitance by using a single polarity power supply.

According to the control method of the variable capacitor of the invention, the positive/negative polarity of the control voltage to be applied is switched, thereby, for example, the capacitance is varied to decrease by the positive polarity and the capacitance is varied to increase by the negative polarity, that is, the wide variable range of capacitance can be obtained even when the single polarity power supply is used, and the capacitance can be varied with good linearity.

An electronic device according to the invention includes a variable capacitor having a pair of electrodes formed so as to sandwich a ferroelectric material layer, in which polarization processing higher than a coercive field in hysteresis characteristics of polarization has been performed to the ferroelectric material layer, and the capacitance is varied in accordance with a control voltage applied to the electrodes.

According to the electronic device of the invention, the variable capacitor according to the invention is included, therefore, performance of the electronic device can be increased.

A communication mobile device according to the invention includes a variable capacitor having a pair of electrodes formed so as to sandwich a ferroelectric material layer, in which polarization processing higher than a coercive field in hysteresis characteristics of polarization has been performed to the ferroelectric material layer, and the capacitance is varied in accordance with a control voltage applied to the electrodes.

According to the communication mobile device of the invention, the variable capacitor according to the invention is included, therefore, performance of the communication mobile device can be increased.

Advantages of the Invention

According to the variable capacitor of the invention, high capacitance can be obtained as well as capacitance variation with good linearity can be obtained. As the same capacitance variation value can be obtained by the same control voltage, the variable capacitor responding to applications of electronic apparatus such as for an electronic device and a communication mobile device.

According to the control method of the variable capacitor of the invention, capacitance variation can be controlled in a range of $\pm \Delta V$ by using 0V as the center, or wide capacitance variation can be controlled by the single polarity power supply, therefore, convenience can be increased responding to applications of electronic apparatus such as for the electronic device and the communication mobile device.

According to the electronic device and the communication mobile device, convenience can be increased by providing with the variable capacitor according to the invention.

BRIEF DESCRIPTION OF THE DRAWINGS

FIG. 17 It is a characteristic chart of a capacitor using barium titanate of related art.

FIG. 18 It is a characteristic chart of a capacitor using barium titanate of related art.

DESCRIPTION OF REFERENCE NUMERALS AND SIGNS

| | |
|---|---|
| 1 | variable capacitor |
| 2 | ferroelectric material layer |
| 3, 4 | electrode |
| 5 | capacitor (variable capacitor) |
| 6 | electrode layer |
| 6A, 6B | electrode |
| 7 | sheet body |
| 8, 9, 10 | characteristics |
| 21 | variable capacitor device |
| 22 | variable capacitor |
| 23 to 24 | DC-cut capacitor |
| 25 | polarity switching element |
| 26 | single polarity power supply |
| 27a, 27b | movable contact |
| 28{28a, 28b)}, 29[29a, 29b] | fixed contact |
| 311, 321 | characteristics |
| 211 | voltage-control variable capacitor |
| 31 to 35 | variable capacitor |
| 36 | AC input terminal |
| 37 | AC output terminal |
| 38, 39 | control terminal |
| 51 | AC circuit |
| 52 | AC power supply |
| 53 | power transformer |
| 54 | stabilizer |
| 55 | DC circuit |
| 56 | rectifying circuit |
| 57 | constant voltage circuit |
| 58 | differential amplifier circuit |
| 59 | output terminal |

BEST MODE FOR CARRYING OUT THE INVENTION

Hereinafter, embodiments of the invention will be explained with reference to the drawings.

First, a variable capacitor according to an embodiment will be explained. The variable capacitor according to the embodiment is configured to have electrodes to be paired with each other are formed so as to sandwich a ferroelectric material layer, in which capacitance can be varied in accordance with a control voltage applied between the both electrodes after polarizing the ferroelectric material layer by applying voltage between the both electrode. The case of using DC bias voltage as the control voltage for capacitance variation will be explained though the capacitance varies in the same manner by using AC bias. The variable capacitor according to the embodiment has characteristics explained below.

Figure 2A:
FIG. 2A, B It is an upper surface view and a cross-sectional view showing another embodiment of the variable capacitor according to the invention.
Figure 2B:
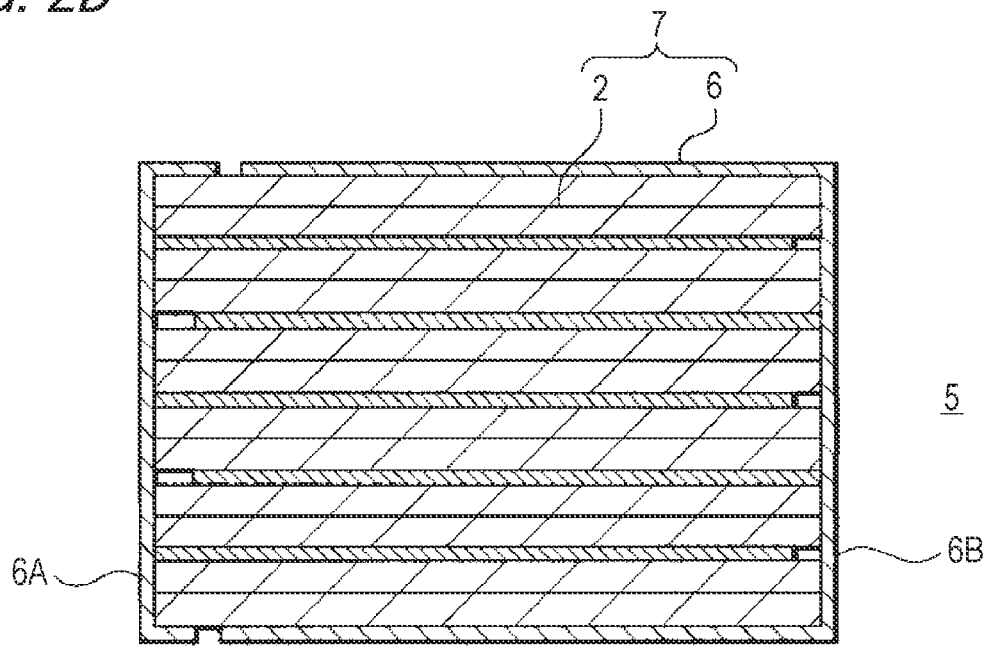

In order to verify the characteristics of the variable capacitor according to the embodiment, a capacitor formed by using lead zirconate titanate (PZT) as the ferroelectric material is used as a sample. The capacitor is basically constructed by forming a pair of electrodes at both surfaces so as to sandwich the PZT material layer, however, a stacked type capacitor 5 using the PZT material layer was fabricated as shown in FIG. 2A (upper surface view) and FIG. 2B (cross-sectional view) in the embodiment. The capacitor 5 as a sample is constructed by stacking plural pieces of, six sheet bodies 7 in the embodiment. Each sheet body 7 is made by forming an electrode layer 6 on one surface of a ferroelectric material layer 2 made of the PZT material layer. Electrode layers 6A in odd-number layers and electrodes layers 6B in even-number layers are electrically connected respectively. The electrode layer 6 is formed at both surfaces of the ferroelectric material layer 2 at any one of the top layer or the bottom layer. The capacitor 5 is an example of the variable capacitor according to the embodiment as clarified later.

As a specific example, the capacitor 5 to be the sample is formed as follows. Powder made of titanium oxide, zirconium oxide and lead oxide are mixed at a desired blending ratio, and two ceramic sheets formed to have a thickness of 60 µm are stacked and pre-sintered. Next, the sheet body 7 in which the electrode layer 6 is formed by applying palladium (Pd) type electrode powder is prepared. The sheet body 4 in which the electrode layer 6 is formed on the two-layer ceramic sheet is taken as a unit, and six sheet bodies 4 are stacked and sintered. Next, conductive paste including silver (Ag) is applied so as to be connected to the electrode layers 6, for example, in odd-number layers exposed at one surface of the stacked body and applied so as to be connected to the electrode layers 6, for example, in even-number layers exposed at the other surface of the stacked body. Then, pairs of electrodes 6A, 6B are formed by performing heat treatment to form the variable capacitor 5. The capacitor 5 formed by sintering is a plate element having a thickness of approximately 0.3 mm with respect to a surface of 5×30 mm$^2$.

Variation of capacitance of the DC bias voltage in the capacitor 5 was measured.

Figure 3:
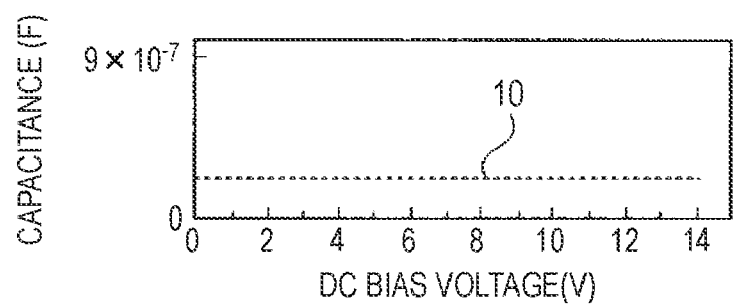
FIG. 3 It is a characteristic chart showing DC bias dependence of capacitance when polarization is not performed to the capacitor having the same configuration of FIG. 2.

First, capacitance dependence of the capacitor 5 by the DC bias voltage, to which poling processing (polarization processing) has not been performed is shown in FIG. 3. The capacitor is an element to which the polarization processing has not been performed after the sintering. The characteristics of capacitance variation of the capacitor in the DC bias voltage were measured. An impedance analyzer 1260 system manufactured by Instron Corporation was used for evaluating characteristics of capacitance variation. As evaluation conditions, applying DC voltage was applied at 0V to 14V in a frequency of 1000 Hz and applying AC voltage of 100 mVp-p. As a result, the capacitance of the capacitor was 0.227 µF and the capacitance did not vary as shown in a characteristic 10 of FIG. 2.

Figure 4A:
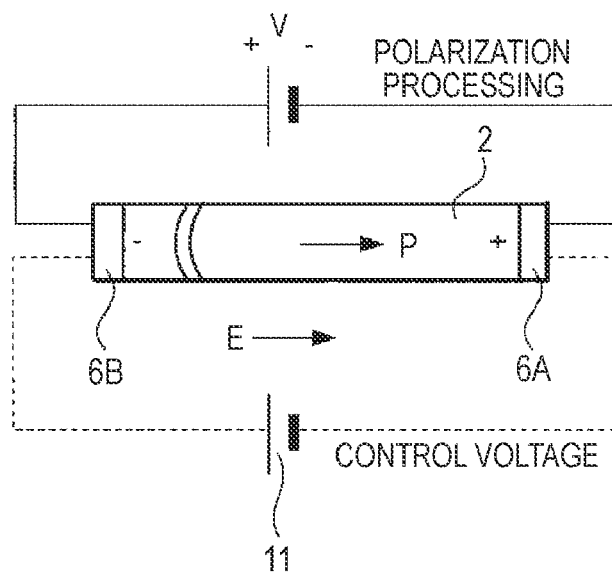
FIG. 4A, B It is a sample and a characteristic chart showing DC bias dependence of capacitance devoted to explanation of the capacitor according to the invention.
Figure 4B:
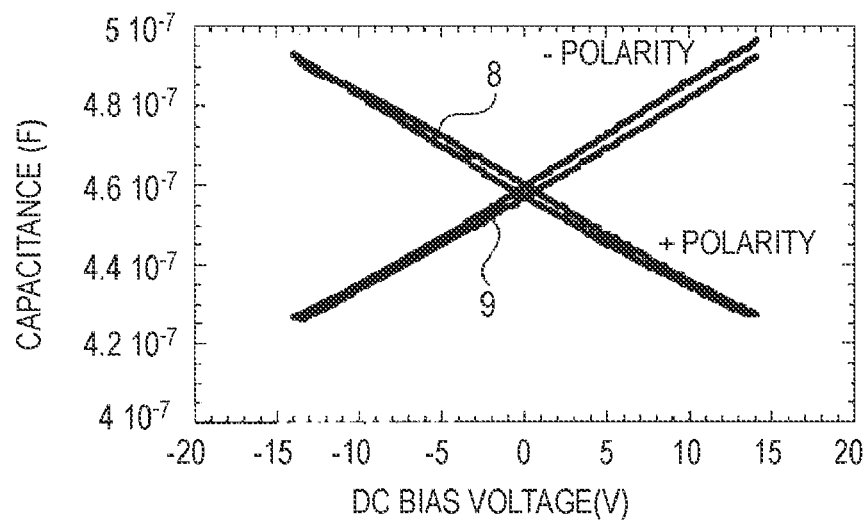

FIG. 4 shows the capacitance dependence of the capacitor 5 by the DC bias voltage, to which the poling processing of aligning polarization of the ferroelectric material layer 2 by applying voltage was performed. The poling processing is performed by applying voltage V, 100V in the embodiment, to the capacitor 5 to be the sample for several dozen seconds by setting the electrode 6B to be positive and the electrode 6A to be negative as shown in FIG. 4A. Then, characteristics of capacitance variation of the capacitor by the DC bias voltage were checked by using the same evaluation system explained in FIG. 3. The direction of polarity of the applied DC bias voltage was the direction shown in FIG. 4A, and the direction (arrow) of a polarization "P" was aligned with the direction of an electric field "E" (arrow) by the DC bias voltage application. A characteristic 8 is shown in FIG. 4B, which was obtained when the polarity of the DC bias voltage after polarization was allowed to be positive (the power supply 11 was connected so that the electrode 6B became positive and the electrode 6A became negative) and the polarity of the DC bias voltage was changed from positive to negative. The characteristic 8 shows a line sloping downward.

Next, a characteristic 9 is shown in FIG. 4B, which was obtained when the DC bias voltage was switched to reverse negative polarity with respect to the capacitor 5 having the same polarizing direction P without changing the polarity direction of the polarity P (the power supply 11 was switched and connected so that the electrode 6A became positive and the electrode 6B became negative) and the polarity of the DC bias voltage is changed from positive to negative. The characteristic 9 shows a line sloping upward.

In FIG. 4, capacitance variation of the capacitor 5 was observed by performing polarization processing, and a capacitance of approximately 460 nF was shown when the DC bias voltage was not applied (namely, at 0V). When capacitance variation was checked by applying the DC bias voltage at ±15V, linear variation was shown, which was different from the B-characteristic and the F-characteristic obtained by capacitors which are commercially available. That is, it was found that polarities of increasing/decreasing of the capacitance vary, namely, the capacitance is increased as well as decreased by changing the polarity of the DC bias to be applied with respect to the polarity of the polarization direction by the poling processing.

Additionally, it was verified that capacitance can be largely changed by changing the polarity of the bias voltage to be applied in a state of fixing the polarity direction of polarization by the poling processing.

Figure 5:
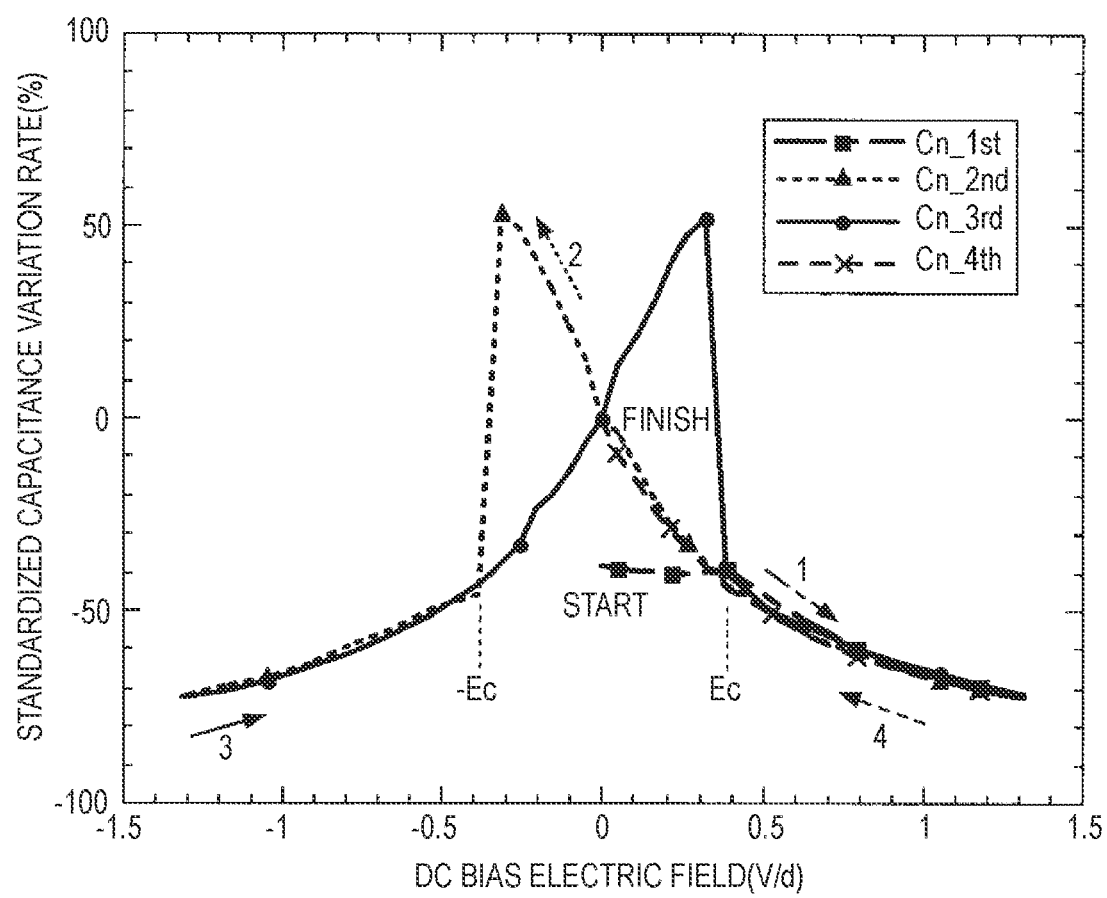
FIG. 5 It is a history characteristic chart of DC bias devoted to explanation of the capacitor according to the invention.

After repeating studies, characteristics of the capacitance having DC bias dependence as shown in FIG. 5 were obtained by applying high voltage to the sample created in the same manner as FIG. 2, namely, the capacitor 5 having the ferroelectric material layer 2 made of the PZT material. When hysteresis characteristics of polarization and electric field of the ferroelectric material layer 2 are measured by using the sample (capacitor 5) having the characteristics, characteristics as shown in FIG. 6 were obtained, and it has been verified that the area in which the capacitance linearly varies corresponds to voltage at coercive field Ec (absolute value) or less of the ferroelectric material layer, namely, voltage between Ec and −Ec.

FIG. 5 shows characteristics obtained by the sample (capacitance 5) to which the poling processing has not been performed. In FIG. 5, magnitude of the DC bias voltage in the horizontal axis is standardized by magnitude of DC bias electric field of applied electric field as voltage of each unit thickness. The applied voltage is ±250V at maximum. The capacitance variation in the vertical axis is standardized by the capacitance variation rate, taking the timing of the applied voltage 0V when returned from 250V after application of the DC bias voltage as a reference. The evaluation was made by an evaluation device capable of applying high DC bias voltage. The evaluation device is characterized by making evaluation by applying external voltage to the sample using a bridge circuit.

In FIG. 5, a portion from the start at the DC bias voltage 0V to a flat position (+Ec) corresponds to a portion from zero to Ec on the way to saturation in the hysteresis curve of polarization. A differential coefficient of the curve corresponds to a capacitance value. Therefore, the capacitance does not vary from the start to Ec.

As shown FIG. 5, application of bias voltage to the sample (capacitance 5) is performed from the bias voltage 0V. The capacitance with respect to application of the bias voltage is fixed and does not vary at first, however, variation of capacitance reduction appears at 0.4V/μm to 0.5V/μm of the electric field. The capacitance is increased when the electric field is reduced from a point of 1.3V/μm in application of 250V and suddenly decreased when the magnitude of the electric field is −0.4V/μm to −0.5V/μm, then, gradually decreased. Furthermore, when the applied bias voltage is increased to return, the capacitance is suddenly decreased, from gradual increase again at 0.4V/μm to 0.5V/μm, then, gradually decreased, which shows hysteresis characteristics which are symmetrical about the origin (0V).

Figure 6A:
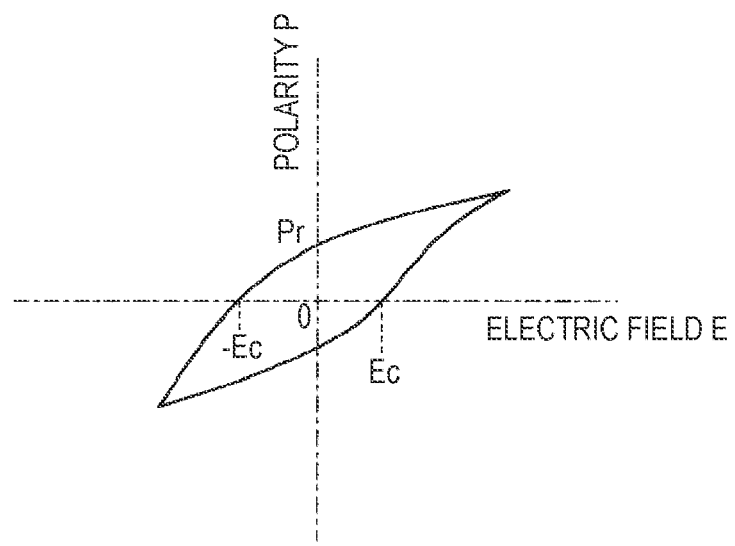
FIG. 6A, B It is a history characteristic chart of DS bias devoted to explanation of the capacitor according to the invention.
Figure 6B:
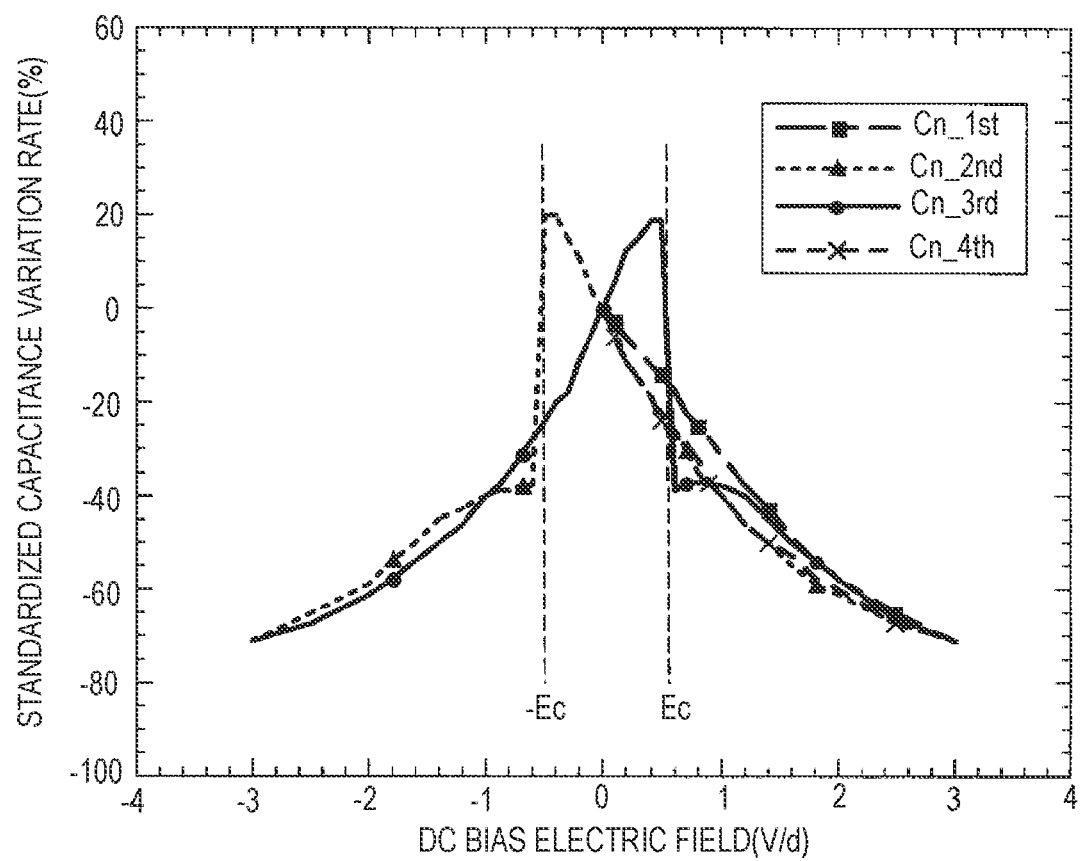

On the other hand, FIG. 6 shows characteristics obtained by the sample (capacitor 5) to which the poling processing has been performed. The horizontal axis and the vertical axis of FIG. 6B represent the standardized electric field and the capacitance variation rate which are the same as shown in FIG. 5. The characteristics of FIG. 6B are the same as the characteristics of FIG. 5. In this case, the poling processing was performed to the sample (capacitor 5) which was measured and evaluated in FIG. 5 and hysteresis characteristics shown by the electric field E and the polarization P in FIG. 6A were evaluated. An evaluation device using a Soya-tower circuit was used for the hysteresis measurement. The evaluation was performed at the application bias voltage of 115Vp-p and at a frequency of 50 Hz according to the usability of the evaluation device. The coercive field Ec of the evaluation is 0.47V/μm, and the magnitude of the electric field at which the capacitance suddenly varies in the DC bias dependence of capacitance variation evaluated in FIG. 5 is 0.4V/μm to 0.5V/μm, therefore, it was shown that the value corresponds to the coercive field.

As apparent from the above FIGS. 4 and 6, the variable capacitor uses the characteristics of capacitance variation in the area depending on the DC bias voltage, particularly, the characteristics of capacitance variation in the area in which the capacitance linearly varies, thereby proving convenience which is easy to be controlled as the circuit. That is, the convenience is increased due to the fact that the capacitance variation has excellent linearity with respect to the DC bias voltage and the fact that the capacitance value is fixed to the same value at the origin (0V) of the DC bias voltage. Additionally, the polarization processing is performed in the certain one direction and the polarity of the DC bias voltage to be applied is changed, thereby increasing the convenience by using the capacitance in a large range of capacitance variation as the approximately double variation amount.

The ferroelectric material used in the embodiment utilizes capacitance variation of voltage control corresponding to the electric field at the coercive field Ec or less. An advantage was found in the embodiment, in which the dielectric material having the limited coercive field Ec can be applied to the variable capacitor in the control of voltage in the area in which the capacitance linearly varies without disagreement capacitance values at the center (origin) by performing polarization processing and using voltage at the coercive field Ec or less. However, the area having the limited coercive field Ec is scientifically limited to a ferroelectric phase in a temperature area having a hysteresis phase. As the temperature is supposed to increase when the variable capacitor is used for the power supply circuit, it is desirable that a usable temperature area is wide as much as possible.

As materials for the ferroelectric material layer used in the variable capacitor in the embodiment, the ferroelectric material by ion polarization and the ferroelectric material by electronic polarization can be used. The ferroelectric material by ion polarization is made of ion crystal materials and electrically polarized by atoms of plus ions and minus ions being displaced. The materials includes, for example, barium titanate $(TiBaO)_3$, $KNbO_3$, $PbTiO_3$ and so on in which an atom A and an atom B are represented by a chemical formula of $ABO_3$ and which has a perovskite structure. The PZT (lead zirconate titanate) used in one of the materials in the embodiment is a ferroelectric material in which lead zirconate $(PbZrO_3)$ is mixed with lead titanate $(PbTiO_3)$.

The ferroelectric material by electronic polarization is a material having the polarization in which the material is divided into a portion deviated to positive charges and a portion deviated to negative charges to generate the electric dipole moment. As the ferroelectric material, rare earth oxide showing ferroelectric characteristics which forms polarization by formation of a charge surface of $Fe^{2+}$ and a charge surface of $Fe^{3+}$ has been reported. This type is represented by a molecular formula "(RE)·(TM)2·O4" by rare earth (RE) and iron family (TM), and it has been reported that materials including the following elements have high dielectric constants.

RE; Y, Er, Yb, Lu (particularly, Y and heavy rare earth elements)

TM; Fe, Co, Ni (particularly Fe)

$ErFe_2O_4$ $LuFe_2O_4$ $YFe_2O_4$

Figure 1:
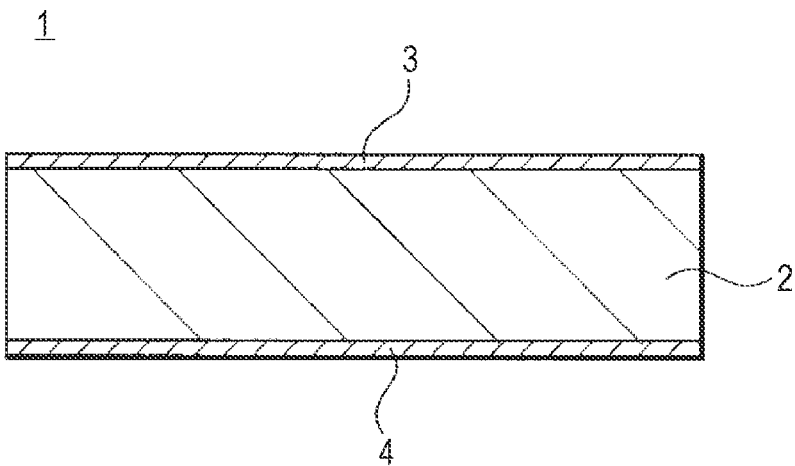
FIG. 1 It is a cross-sectional view showing an embodiment of a variable capacitor according to the invention.

The variable capacitor according to the embodiment of the invention is configured by utilizing characteristics of the ferroelectric material layer to which the polarization processing has been performed as described above. The variable capacitor of the embodiment according to a basic structure can be formed in a single-layer type structure or a stacked-layer type structure. For example, in the case of the single-layer type structure, the variable capacitor 1 includes electrodes 3, 4 to be paired with each other formed at both surfaces so as to sandwich the ferroelectric material layer 2 as shown in FIG. 1. In the case of the stacked-layer type structure, the variable capacitor 5 is formed in a manner in which the electrode 6A, the ferroelectric material layer 2, the electrode 6B and the ferroelectric material layer 2 are stacked in order, and finally, each ferroelectric material layer 2 is sandwiched by the electrodes 6A, 6B. In the case of the stacked-layer structure, structures of parallel connection or serial connection can be applied.

The ferroelectric material layer 2 is made of the ferroelectric phase material having hysteresis characteristics and the polarization processing higher than the coercive field Ec (absolute value) in the hysteresis characteristics of polarization has been performed thereto. The polarization processing in this case includes any one of a state in which polarization has reached saturation and a state in which polarization has not reached saturation, namely, a so-called unsaturated state. Then, the variable capacitors 1, 5 are constructed so that the capacitance varies in accordance with the control voltage, namely, the DC bias voltage applied between the electrodes 3, 4 or between the electrodes 6A, 6B in the temperature area of the ferroelectric phase having hysteresis characteristics.

According to the variable capacitor of the embodiment, the polarization processing higher than the magnitude of the coercive field Ec (absolute value) is performed and the DC bias voltage is varied in the temperature area of the ferroelectric phase including hysteresis characteristics, thereby obtaining large capacitance as well as varying the capacitance as shown by the above characteristic verification. The fixed same capacitance variation value can be obtained by the same control voltage. When using the area of voltage less than the coercive field, capacitance variation having good linearity can be obtained in the control of the DC bias voltage. Additionally, the range of variable capacitance can be taken to be large. When the polarization processing is performed to the saturated state, the variable range can be taken large.

A variable capacitor according to another embodiment of the invention can be configured by performing polarization processing of the unsaturated state with respect to the ferroelectric material layer 2. That is, the structure in which the polarization state of the ferroelectric material layer 2 to which the polarization processing has been performed is in the unsaturated state can be applied.

The variable capacitor according to another embodiment of the invention can be configured so that the capacitance varies linearly (in a straight line) in accordance with the DC bias voltage applied between the pair of electrodes by using the capacitance at zero bias voltage as the center in the area of voltage less than the coercive field Ec in the hysteresis characteristics of polarization. As the capacitance linearly varies to the positive direction and the negative direction with the zero bias voltage as the center, the wide range of capacitance variation can be obtained. Additionally, the capacitance at the zero bias voltage is used as the center, thereby allowing circuit design of electronic devices to be easier. For example, it is possible to avoid deviation of the center frequency in communication mobile devices such as a cellular phone and an IC card which will be described later.

The variable capacitor according to another embodiment of the invention can be configured so that the capacitance varies by controlling the bias voltage to be applied between the pair of electrodes in a range of a positive side including 0V or not including 0V, a range of negative side including 0V or not including 0V, or a range over the positive side and the negative side including 0V. In this configuration, the capacitance can be linearly varied when using voltage lower than the coercive field Ec of hysteresis characteristics of polarization. When using voltage higher than the coercive field Ec, the capacitance can be varied along a gradual curve with less linearity. The so-called capacitance can be varied with linearity, with monotone increasing or monotone decreasing including gradual curves.

The variable capacitor according to further another embodiment can be configured so that the DC bias voltage to be applied is controlled in a range of $\pm \Delta V$ by using 0V as the center.

As described above, according to the variable capacitor of the embodiments of the invention, the linearity in capacitance variation is obtained as well as deviation of capacitance at 0V (origin) is eliminated by using the ferroelectric material having hysteresis characteristics including the finite coercive field Ec and changing capacitance under the control by, for example, the DC bias voltage corresponding to voltage less than the coercive field Ec. In addition, the area of capacitance variation can be increased by fixing the polarization direction to invert the polarity of the DC bias voltage to be applied. The variable capacitor according to the embodiment has the above advantages, therefore, it is possible to design, for example, a circuit for reducing power consumption easily, which contributes to improvement of efficiency in reducing power consumption.

The variable capacitor according to the embodiment can control capacitance variation linearly and can change the capacitance and capacitance variation thereof largely, therefore, the variable capacitor can respond to applications of electronic apparatus such as a circuit and a mobile device requiring reduction of power consumption, which can be applied to various applications.

In the control of capacitance variation by voltage, control from the fixed capacitance value of the origin (0V) in the state of not applying the control voltage can be performed easily. Accordingly, the variable capacitor of the embodiment can be applied as the variable capacitor, for example, not only to the power supply circuit for saving energy but also to a tuning circuit of a radio frequency of antenna communication of mobile devices whose development is proceeding concerning IT devices.

It has been found that the peak voltage (electric field) of the type of barium titanate by the DC bias dependence also corresponds to the coercive field Ec. Appearance of the coercive field Ec is also due to a structure by lattice strain in the material, therefore, barium titanate can be used as the variable capacitor according to the embodiment, for example, when forming barium titanate having a structure utilizing interface strain for increasing the coercive field.

In the embodiment, the study was performed by using the PZT type material having the perovskite structure as the ferroelectric material, however, both the ferroelectric material by the ion polarization and the ferroelectric material by the electronic polarization can be used for the variable capacitor of the embodiment as long as it is the ferroelectric material in which the hard-type coercive field Ec appears, which includes the perovskite type material.

The materials obtained by the study are ferroelectric materials and belong to oxide series, therefore, the thickness of the ferroelectric material layer can be designed to the thickness matching to withstand pressure easily, thereby manufacturing the variable capacitor easily.

Figure 7:
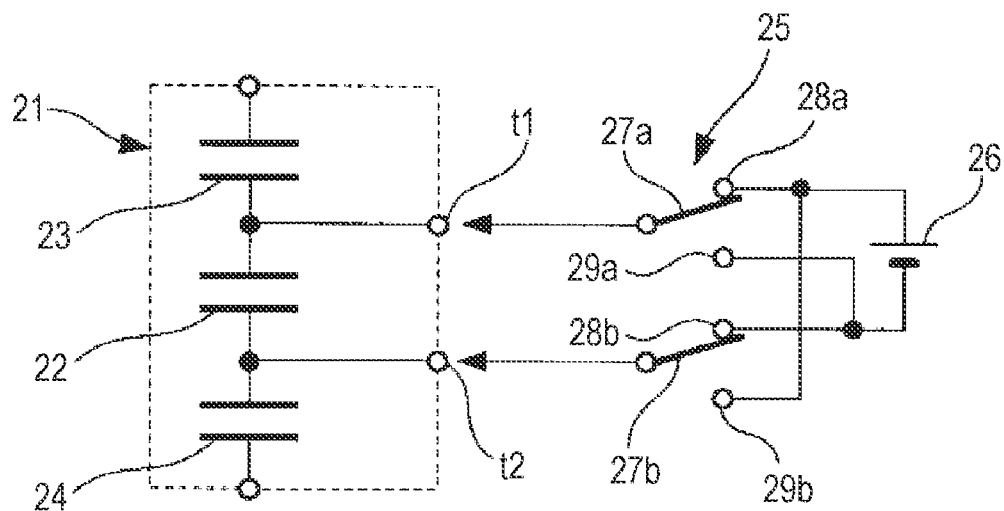
FIG. 7 It is a configuration diagram showing an example of a variable capacitor device according to the invention.
Figure 8:
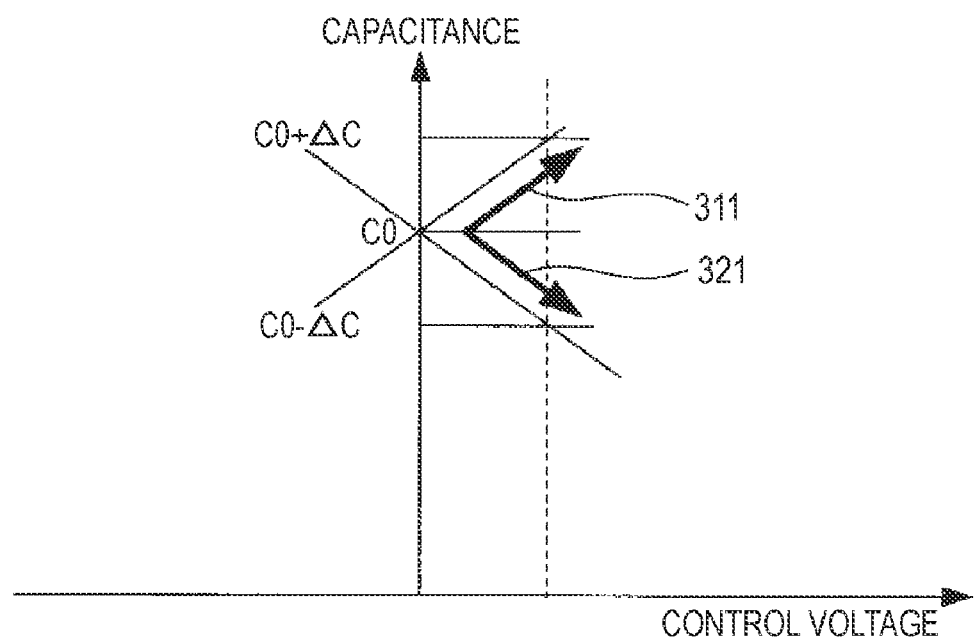
FIG. 8 It is a characteristic chart of capacitance/control voltage of the capacitor of FIG. 7.

FIG. 7 and FIG. 8 show further another embodiment of the invention. The variable capacitor according to the embodiment is configured to use a single polarity power supply and to switch the polarity of the DC bias voltage as control voltage to be applied to both ends of the variable capacitor so that the increasing/decreasing width of capacitance can be taken large. In the embodiment, a variable capacitor device 21 is configured by including a variable capacitor 22 having the same configuration as the above and DC-cut capacitors 23, 24 connected in series at both ends. A single polarity power supply 26 supplying the control voltage (DC bias voltage) to both ends of the variable capacitor 22 in the variable capacitor device 21 is connected through a polarity switching element 25. The polarity switching element 25 includes movable contacts 27a, 27b connected to terminals t1, t2 led out from both ends of the variable capacitor 22 and two pairs of fixed contacts 28 (28a, 28b) and 29 (29a, 29b) which are paired to each other. Respective contacts 28a, 29a on one side of the fixed contacts 28, 29 which are paired with each other are connected to the positive side of the single polarity power supply and the contacts 28b, 29b on the other side are connected to the negative side of the single polarity power supply 26.

Control operations of the variable capacitance element 22 will be explained. The movable contacts 27a, 27b are connected to the fixed contacts 28a, 28b on one side of the polarity switching element 25 to allow the control voltage to be varied from 0V to the positive side. It is desirable that the variable range of the control voltage at this time is the range in which the capacitance linearly varies as shown in FIGS. 4 and 6. When the control voltage is varied from 0V to the positive side, the capacitance is increased as shown by a characteristic 311 of FIG. 8. That is, the capacitance is increased from a capacitance C0 when the control voltage is 0V to a capacitance C0+ΔC.

Next, when the capacitance is desired to be further decreased by allowing the control voltage to be 0V or less, the polarity of the control voltage to be applied to the variable capacitor 22 is switched. That is, the movable contacts 27a, 27b of the polarity switching element 25 are switched to the fixed contacts 29a, 29b. Accordingly, the polarity of the control voltage from the single polarity power supply 26 is switched and the voltage is applied to the variable capacitor 22. It is also desirable that the variable range of the control voltage at this time is the range in which the capacitance linearly varies as shown in FIGS. 4 and 6. When the control voltage is varied from 0V to the positive side, the capacitance is decreased as shown by a characteristic 321 of FIG. 8. That is, the capacitance is increased from a capacitance C0 when the control voltage is 0V to a capacitance C0−ΔC.

According to the variable capacitor 22 of the embodiment, the control of C0±ΔC in the capacitance of the variable capacitor 22 can be performed only by the single polarity power supply 25 which is so-called one side power supply. The capacitance variation can be increased at low voltage. When the polarity is not switched, the capacitance variation will be equal to (C0+ΔC)/C. When the polarity is switched, the capacitance variation will be equal to (C0−ΔC)/(C0−ΔC).

Figure 10:
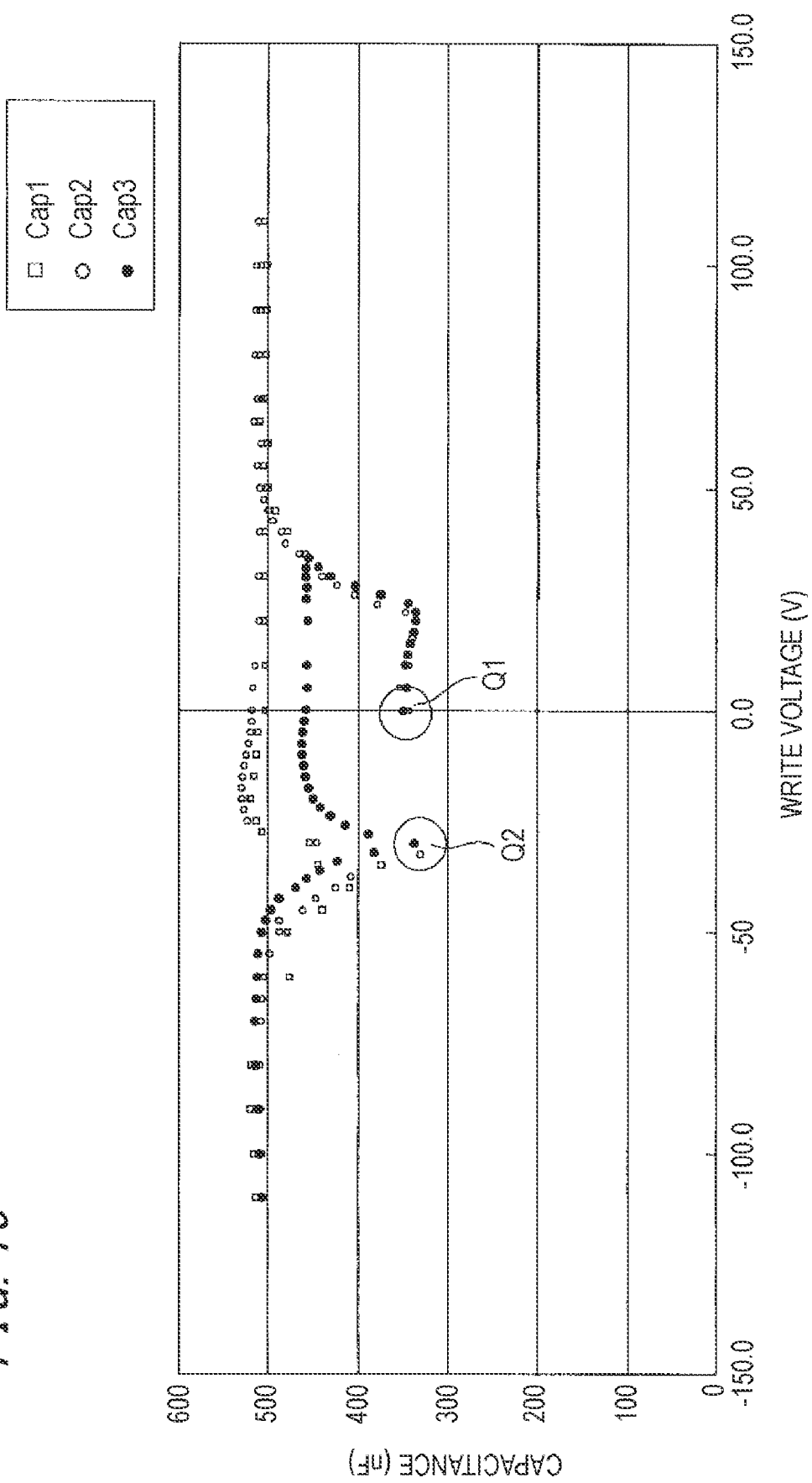
FIG. 10 It is a characteristic chart of capacitance/write voltage concerning rewriting devoted to explanation of the invention.

The variable capacitor according to the embodiment can rewrite the capacitance. FIG. 10 shows variation of capacitance values when write voltages V are applied. The capacitance value is a value obtained when the write voltage at that time is allowed to be 0V once. The sample used as a start evaluation sample was obtained by performing heat treatment to the capacitor to which the polarization processing has been performed by using PZT as the ferroelectric material to be higher than Curie temperature so that the sum of electric dipole moment becomes minimum, namely, heat treatment by a silicon oil bath at 240° C. in the embodiment. The sample in which the polarization was eliminated to be a virgin state was used. There are two methods for eliminating the polarization. There is a temperature elimination which reduces the sum of the electric dipole moment (so-called the sum of polarization) by heat treatment and a voltage elimination or an electrical elimination which reduces the sum of the electric dipole moment by voltage. The measurement of the write capacitance with respect to the variable capacitor of the sample was made by returning the applied voltage to 0V once after the rewrite voltage of DC has been applied.

A characteristic Cap1 in FIG. 10 shows variation of capacitance values of the variable capacitor observed when the write voltage V was increased from 0V to 110V, then, decreased to be −110V after the polarity was inverted.

A characteristic Cap2 in FIG. 10 shows variation of capacitance values of the variable capacitor observed when the write voltage V was increased from 0V to 110V and decreased to be −110V after the polarity was inverted in the same manner as in the case of Cap1, which shows the repeatability of the Cap1. It can be seen that the repeatability is good.

Next, a characteristic Cap3 in FIG. 10 shows variation of capacitance values of the variable capacitor observed when the write voltage V was increased from 0V to 40V and the magnitude of the polarity of the write voltage was changed once, then, the voltage was decreased to −110V.

It can be seen that capacitances corresponding to the write voltages are written and held from FIG. 10.

As can be seen from the characteristics Caps1, 2 shown in FIG. 10, in the process of reducing the write voltage from 110V to 0V, the capacitance value is held to be an approximately fixed value. When the negative write voltage is further applied, the capacitance value is gradually increased and begins to decrease when the write voltage is −20V. The write voltage V at this time is defined as a depolarization voltage at which the capacitance value begins to decrease, which corresponds to a depolarization electric field. In the depolarization voltage, the polarizability in the ferroelectric material layer is reduced as the domain of polarization begins to be inverted, therefore, the capacitance value also begins to decrease. The minimum value of the capacitance value is observed when the write voltage V is −32.5V, and the capacitance value begins to increase when the write voltage is further decreased. The capacitance value comes close to a saturated value when the write voltage is −60V.

Figure 9:
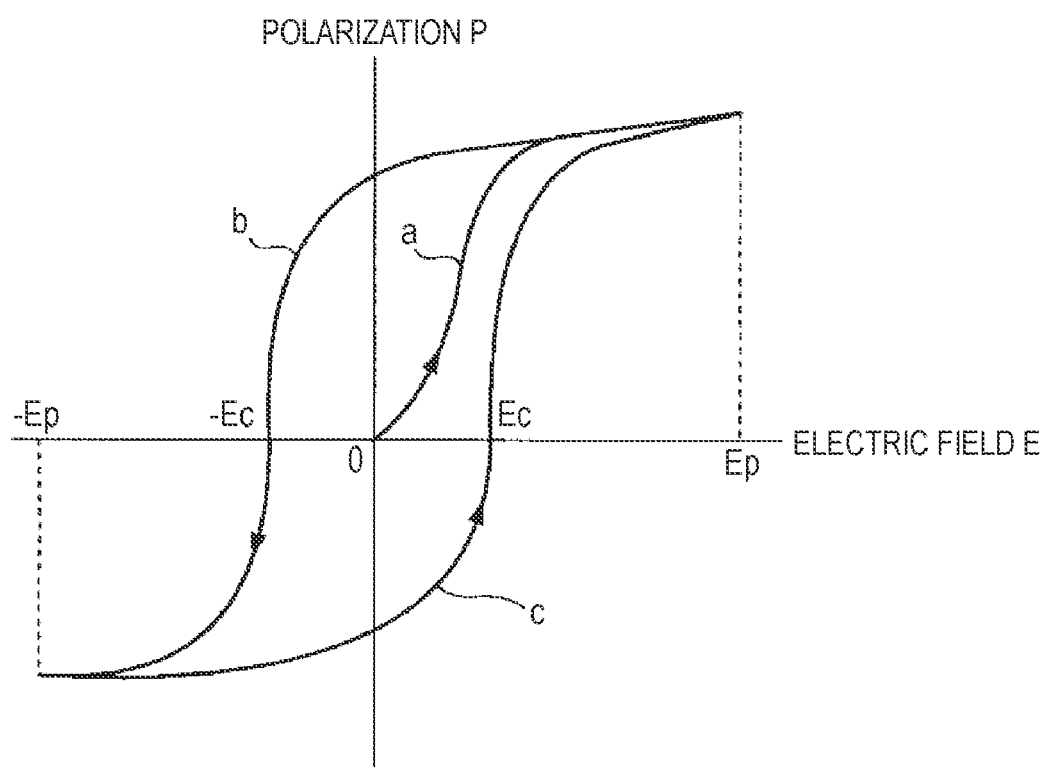
FIG. 9 It is a hysteresis characteristic chart of polarization devoted to explanation of the invention.

The variation of capacitance values corresponds to a curve "b" of the hysteresis characteristics in FIG. 9. The write voltage V of −32.5V at which the capacitance value becomes minimum corresponds to the coercive field Ec of the hysteresis characteristics. At the coercive field Ec, the sum of the electric dipole moment is minimum and the capacitance value becomes minimum. The write voltage V of −60V corresponds to a saturated electric field −Ep on the negative side in the hysteresis characteristics. When the write voltage V corresponding to the saturated electric field is applied, the sum of the electric dipole moment in the ferroelectric layer becomes maximum and the capacitance value becomes maximum.

In order to rewrite the capacitance with respect to the written high capacitance (capacitance in the saturated state), the polarity of the applied voltage is changed to negative and a desired voltage is applied, thereby rewriting the capacitance. The capacitance can be rewritten in a negative voltage area, particularly, in the area from the depolarization voltage to the voltage at which the capacitance is saturated through the vicinity of the voltage −Vc corresponding to the negative coercive field −Ec at which the capacitance is minimum.

In FIG. 10, a mark Q1 shows the capacitance value by the temperature elimination and a mark Q2 shows the capacitance value by the electrical elimination. As can be seen from the capacitance values Q1, Q2, voltage control of allowing the voltage to be −Vc which is the electrical elimination can minimalize the capacitance effectively at the time of rewriting as compared with the case of temperature elimination. That is, the capacitance C by the voltage (−Vc) elimination C(−Vc) is approximately 320 nF, and the capacitance by the temperature elimination C0 is approximately 350 nF. The capacitance can be reduced by the voltage writing elimination than by the temperature elimination.

Figure 11:
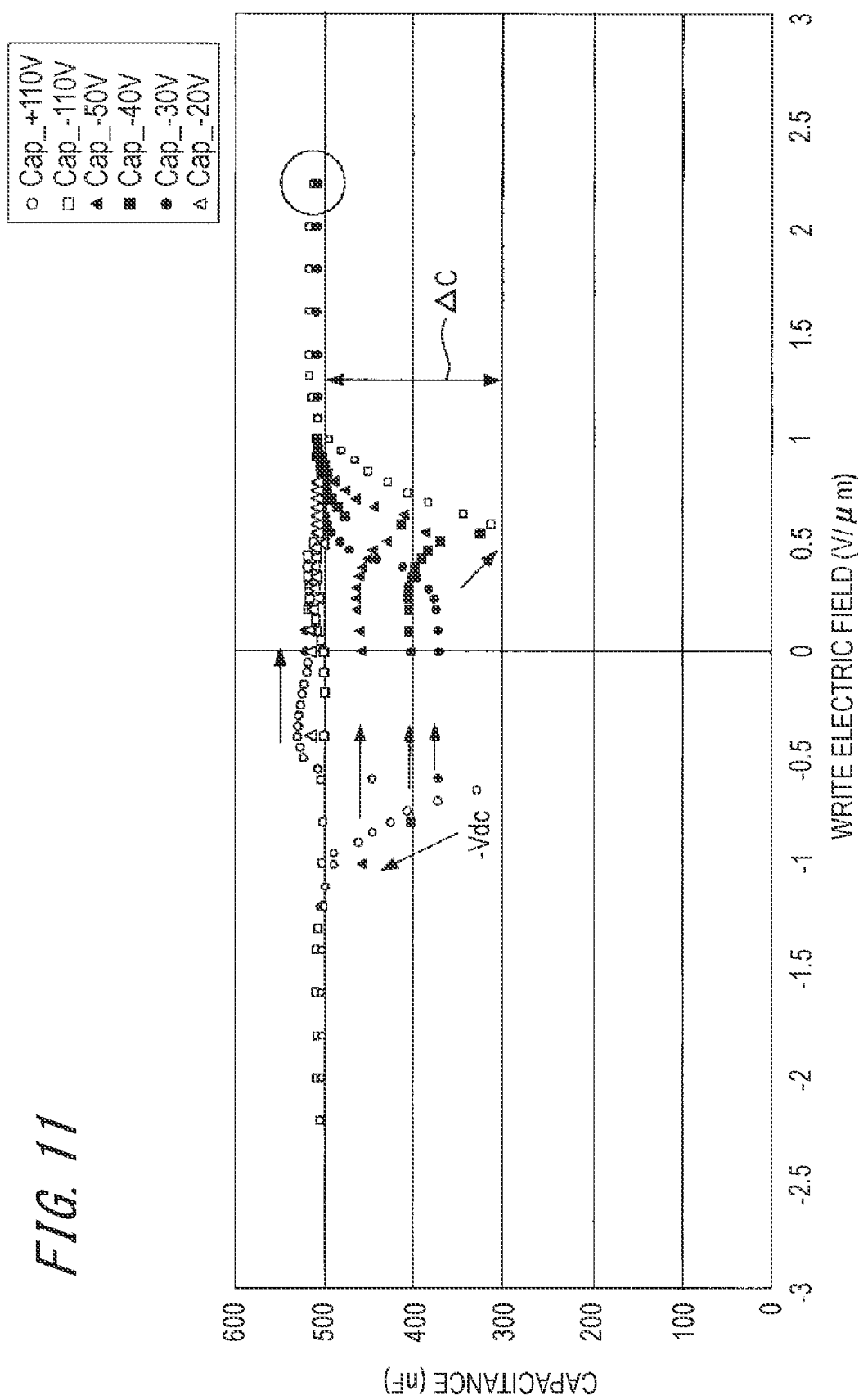
FIG. 11 It is a characteristic chart of write voltages by rewriting processing voltages and capacitor variation devoted to explanation of the invention.

FIG. 11 shows the relation between write electric fields and capacitance variation by the preprocessing voltage (rewriting processing voltage). FIG. 11 shows capacitance values measured when, after the preprocessing of polarization processing of +110V (preprocessing 1) was performed to the variable capacitor as the sample, voltages of next preprocessing (preprocessing 2)+110V, −110V, −50V, −40V, −30V and −20V were applied, then, respective positive write voltages were applied. In FIG. 11, the horizontal axis represents the write electric field (V/μm) and the vertical axis represents the capacitance value (nF).

A characteristic Cap+110V shows variation of capacitance values observed when, after the preprocessing 2 was performed at 110V, the write voltage V is decreased from +110V to −110V, then, the voltage was increased to the positive side.

A characteristic Cap-110V shows variation of capacitance values observed when, after the preprocessing 2 was performed at −110V, the write voltage V was increased from −110V to the positive side.

A characteristic Cap-50V shows variation of capacitance values observed when, after the preprocessing 2 was performed at −50V, the write voltage V was increased from 0V to the positive side.

A characteristic Cap-40V shows variation of capacitance values observed when, after the preprocessing 2 was performed at −40V, the write voltage V was increased from 0V to the positive side.

A characteristic Cap-30V shows variation of capacitance values observed when, after the preprocessing 2 was performed at −30V, the write voltage V was increased from 0V to the positive side.

A characteristic Cap-20V shows variation of capacitance values observed when, after the preprocessing 2 was performed at −20V, the write voltage V was increased from 0V to the positive side.

In each case, the applied voltage was applied for ten seconds to fix the capacitance as the preprocessing, after that, the voltage was changed.

As can be seen from FIG. 11, the variation width of capacitance variation by the write voltage, namely, the variation amount ΔC from the minimum value to the maximum value of capacitance values is larger in the case in which the preprocessing voltages of +110V, −110V whereby the saturated capacitance values can be obtained were applied at first than in the case in which preprocessing voltages having smaller absolute values were applied.

As apparent from FIG. 11, in the preprocessing by the negative DC apply voltage, the preprocessing of rewriting is possible from the point of the depolarization voltage at which the saturated capacitance begins to decrease toward the voltage −Vc corresponding to the coercive field −Ec on the hysteresis characteristics of polarization to the saturated voltage which has been polarized and inverted in the preprocessing by negative DC voltage application. However, in this case, the width, namely, the variation amount ΔC can be taken larger when the capacitance is written in the positive voltage nest in the case in which a voltage higher than −Vc is applied as the negative preprocessing voltage. The area of the rewriting processing from −Vc to a voltage at an area where the capacitance reaches the maximum, namely, electric field derivation of capacitance variation becomes zero (V=V(dC/dV=0) is actually effective.

In order to rewrite the capacitance, a higher voltage than the write voltage corresponding to the capacitance which has been written before is applied, thereby rewriting the larger capacitance than the previously written capacitance. On the other hand, the previous writing state is not actually known at the time of rewriting the capacitance, therefore, the high voltage is applied once to perform polarization processing, then, the writing voltage is controlled from that state, thereby writing a desired capacitance value easily and conveniently.

The variable capacitor according to the embodiment of the invention can be configured so that the variation amount ΔC of capacitance values can be arbitrarily controlled in the control voltage (DC bias voltage) by using characteristics of FIG. 10 and FIG. 11 and selecting the magnitude of polarization voltage by the polarization processing whereby a desired polarizability can be obtained. For example, in the variable capacitor in which the poling processing has been performed to the ferroelectric material layer, a voltage having a reverse polarity to the polarizing direction by the poling processing is applied to thereby perform repolarization processing having a desired polarizability. The variable capacitor according to the embodiment can be configured so that the variation amount ΔC of capacitance values of rewriting, namely, the increasing/decreasing gradient as well as the increasing/decreasing width of rewriting capacitance can be arbitrary controlled.

The variable capacitor according to the embodiment of the invention can be configured to control the variation amount of capacitance values in accordance with the magnitude of rewriting voltage by resetting the capacitance in voltages in the range from the voltage corresponding to the depolarization electric field at which the polarization is reduced to the voltage corresponding to the polarization inversion saturated electric field to thereby rewrite the capacitance.

Figure 12:
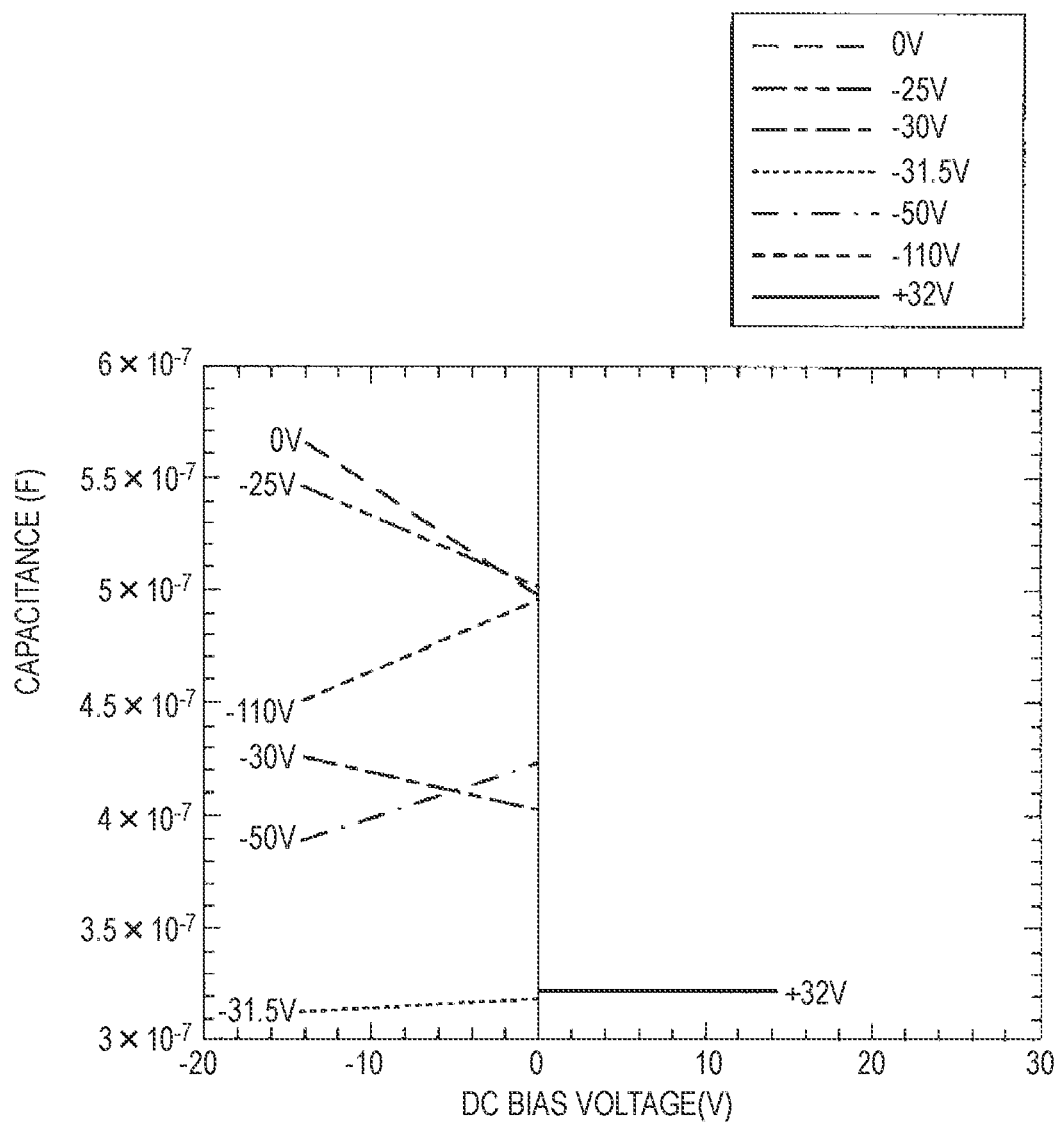
FIG. 12 It is a characteristic chart showing DC bias voltage dependence of capacitance after polarization processing and preprocessing devoted to explanation of the invention.

FIG. 12 shows DC bias voltage dependence of capacitance values after the polarization processing and the processing of applying a negative preprocessing voltage −Vdc. The polarization processing is performed to the sample of the capacitor using PZT by applying +110V in the direction of voltage shown in FIG. 4A. Next, negative preprocessing voltages (DC voltage) −Vdc were given as parameters as the preprocessing, and the DC bias voltages by capacitance variation after respective preprocessing were measured. AC conditions for measurement are 120 Hz, 500 mVac. The polarity of the preprocessing voltage and the polarity of the DC bias voltage are based on the positive polarity which is the polarization direction.

In FIG. 12, variations of DC bias characteristics of respective capacitances obtained when voltages of preprocessing 2 Vdc were 0V, −25V, −30V, −31.5V, −50V, −110V, and +32V were measured. When the negative preprocessing voltage was high, large capacitance variation which was upward-sloping and linear was shown at first, however, when the negative preprocessing voltage becomes higher, the capacitance variation becomes lower, and a plot area in which the capacitance does not vary appeared when Vdc was −31.5V which corresponds to the voltage −Vc. The linear variations of respective capacitances were obtained because voltages were applied in the voltage area lower than the coercive field. The appearance of the plot area in which the capacitance of Vdc does not vary is due to the voltage control in this case, however, corresponds to variation of DC bias characteristics of voltages lower than Vc in which the capacitance does not vary by the DC bias voltage in the case of eliminating polarization by temperature processing.

When preprocessing voltages exceeding the voltage corresponding to the negative coercive field (−Vc) are applied, the polarity of increasing/decreasing in capacitance variation varies this time, and variations sloping downward are observed. When the negative preprocessing voltage becomes further higher, characteristics in which the capacitance variation rate largely varies can be obtained. That is, a gradient (slope) θ of capacitance variation and the variation amount ΔC of capacitance can be changed by the magnitude of the negative preprocessing voltages including 0V.

Figure 13:
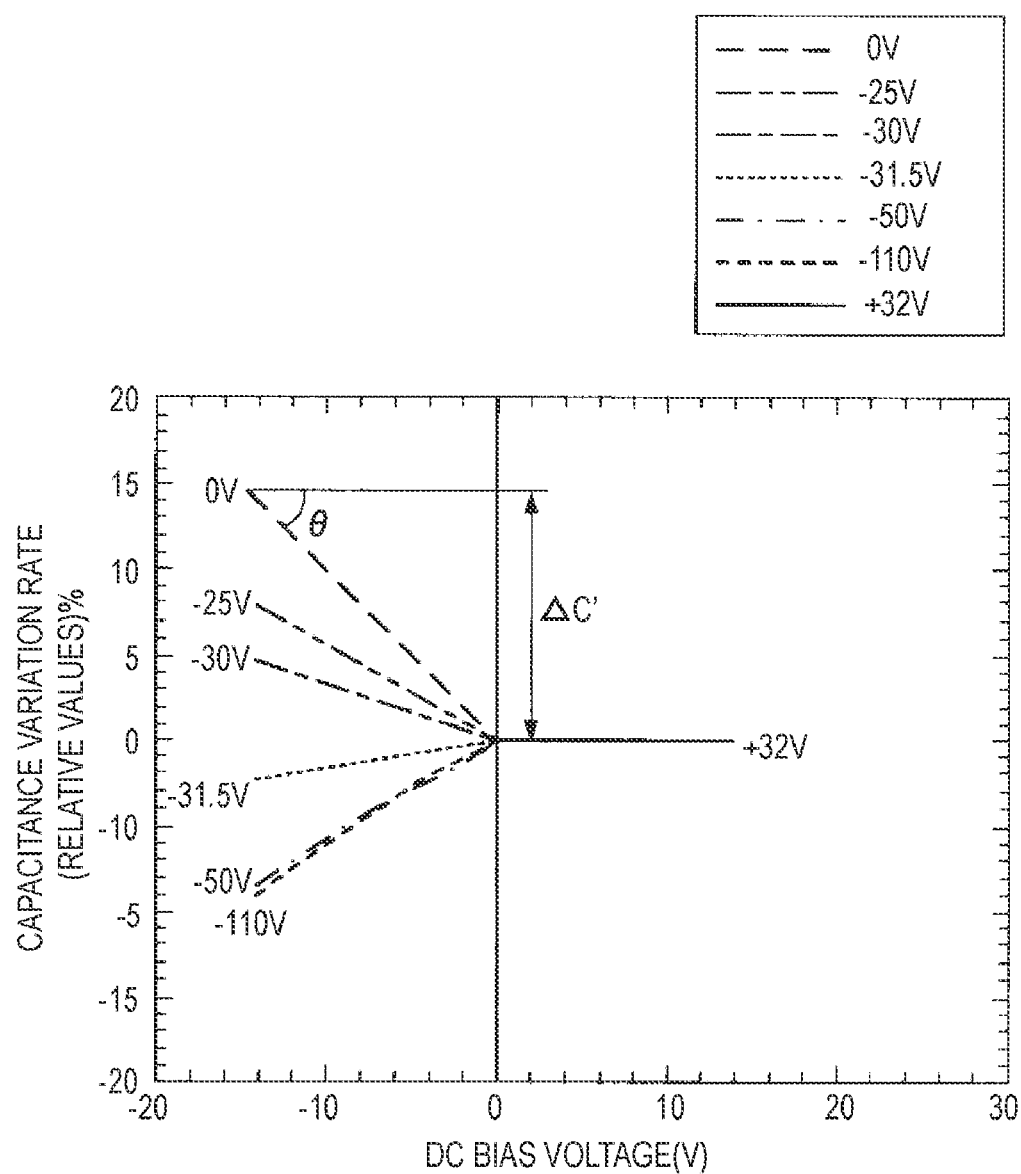
FIG. 13 It is a characteristic chart obtained by relatively varying capacitance of FIG. 12 using a preprocessing voltage 0V as a reference.

FIG. 13 is a graph showing variation of absolute values of capacitance variation obtained by relatively changing the negative preprocessing voltages by using the capacitance at 0V as a reference. It is found that the polarities in which the capacitance increases or decreases (variations of upward sloping and downward sloping of capacitance) are inverted with respect to the voltage when the polarity of the measured DC bias voltage is changed.

Figure 14:
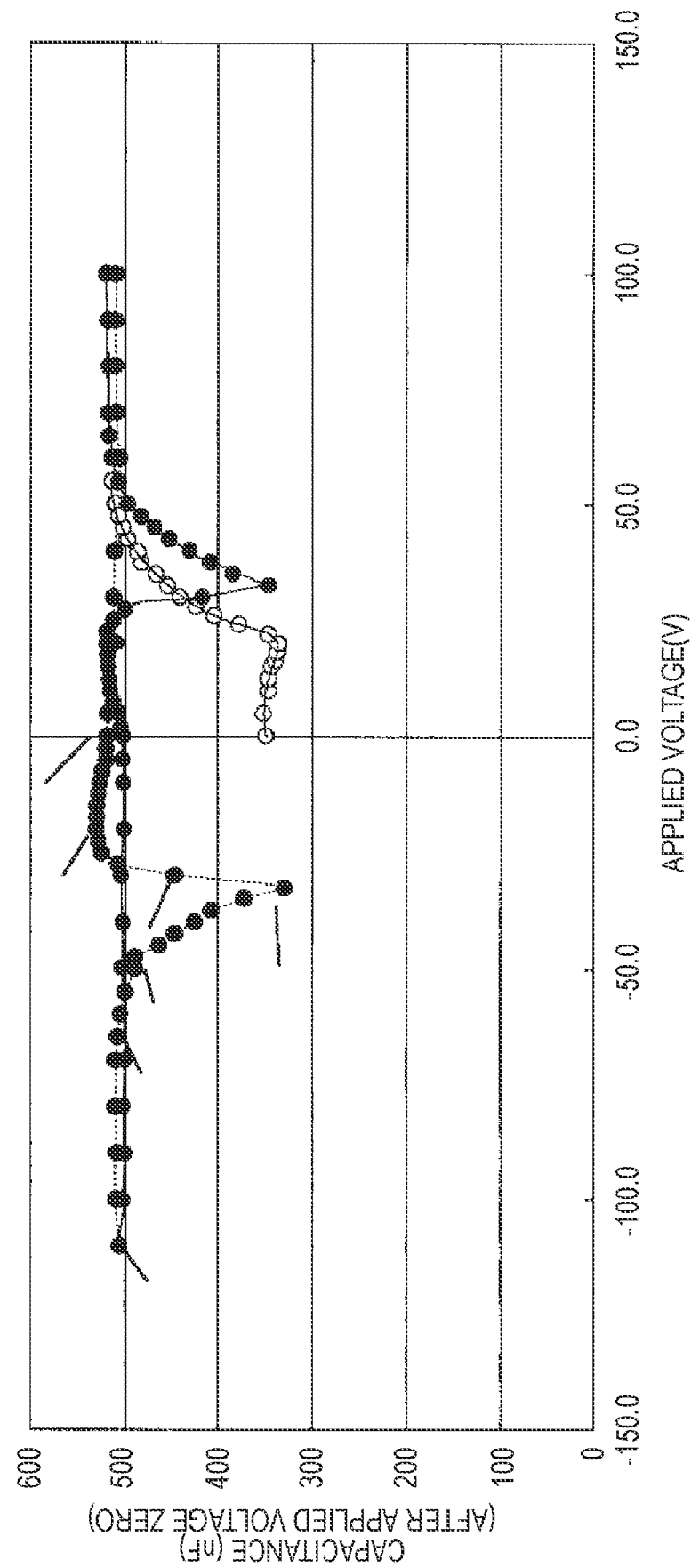
FIG. 14 It is a characteristic chart showing DC bias voltage dependence of capacitance by writing preprocessing voltages devoted to explanation of the invention.

FIG. 14 shows an outline of the DC bias dependence of capacitance by the negative preprocessing voltages. FIG. 14 is a schematic graph showing capacitance variation by the preprocessing voltages obtained from FIG. 12 and FIG. 13, particularly, capacitance variation by capacitances corresponding to respective negative preprocessing voltages and DC bias voltages after the preprocessing as a visual characteristic variation. The variation amount by the DC bias characteristics of capacitance and the variation gradient thereof are highest with the variation gradient which is upward to the left at the time of 0V where the negative preprocessing voltage is not applied. As the negative preprocessing voltages are applied, the variation amount and the gradient of capacitance become smaller and the capacitance becomes minimum when V=−Vc and capacitance variation is zero. When the voltage exceeds −Vc, it is found that capacitance begins to vary and increase with the changed polarity of increasing/decreasing variation of capacitance.

The variable capacitor according to the embodiment can be configured to arbitrarily control the gradient θ of capacitance variation and the variation amount ΔC' of capacitance values by the control voltage (DC bias voltage) by using characteristics shown in FIG. 12 to FIG. 14 and selecting the magnitude of polarization voltage by polarization processing whereby a desired polarizability can be obtained. For example, in the variable capacitor in which the poling processing has been performed to the ferroelectric material layer, the voltage having the reverse polarity to the polarization direction by the poling processing is applied to perform repolarization processing having a desired polarizability. The variable capacitor according to the embodiment can be configured to arbitrarily control the gradient θ of capacitance variation and the variation amount ΔC' of capacitance values by the control voltage in accordance with the magnitude of the applied voltage in the repolarization processing.

The variable capacitor according to the embodiment of the invention can be applied to electronic devices corresponding to various applications such as a power supply circuit which will be described later. Accordingly, the electronic device including the variable capacitor having the above characteristics can be configured in the embodiments of the invention.

The variable capacitor according to the embodiments of the invention can be applied to communication mobile devices such as an IC card and a cellular phone. Therefore, the mobile device including the variable capacitor having the above characteristics can be configured in the invention. Particularly, the invention can be applied to the capacitor in a tuning circuit for selecting radio frequencies of antenna communication in the mobile device. In this case, it is preferable to incorporate the variable capacitor in which capacitance is varied linearly by controlling the control voltage in the range over positive and negative voltages by using 0V as the center.

According to the communication mobile device of the embodiment, the configuration of incorporating the variable capacitor capable of changing the capacitance by controlling the control voltage, for example, in the range over positive and negative voltages by using 0V as the center is applied, thereby increasing the variable range of the capacitance as well as avoiding the center frequency in the mobile device from being shifted even when the voltage is not applied. When the frequency is adjusted in the device by using the variable capacitor in related art which changes the capacitance in the range from 0V to the positive side, for example, 5V, it is necessary to set the center frequency at 2.5V of the center and to set the frequency to be negative at 0V as well as to set the frequency to be positive at 5V. In this device, the center frequency is shifted when voltage is not applied. For example, when an IC card is used from the state of not being used without voltage, the frequency is started from the state of the shifted frequency. The variable capacitor incorporated in the embodiment is convenient because the capacitor can vary the capacitance in a range over the positive and negative voltages by using 0V as the center, therefore, the center frequency can be set at 0V even when voltage is not applied. The capacitor according to the embodiment is suitable to be applied to communication mobile devices such as the cellular phone and the IC card.

Figure 15:
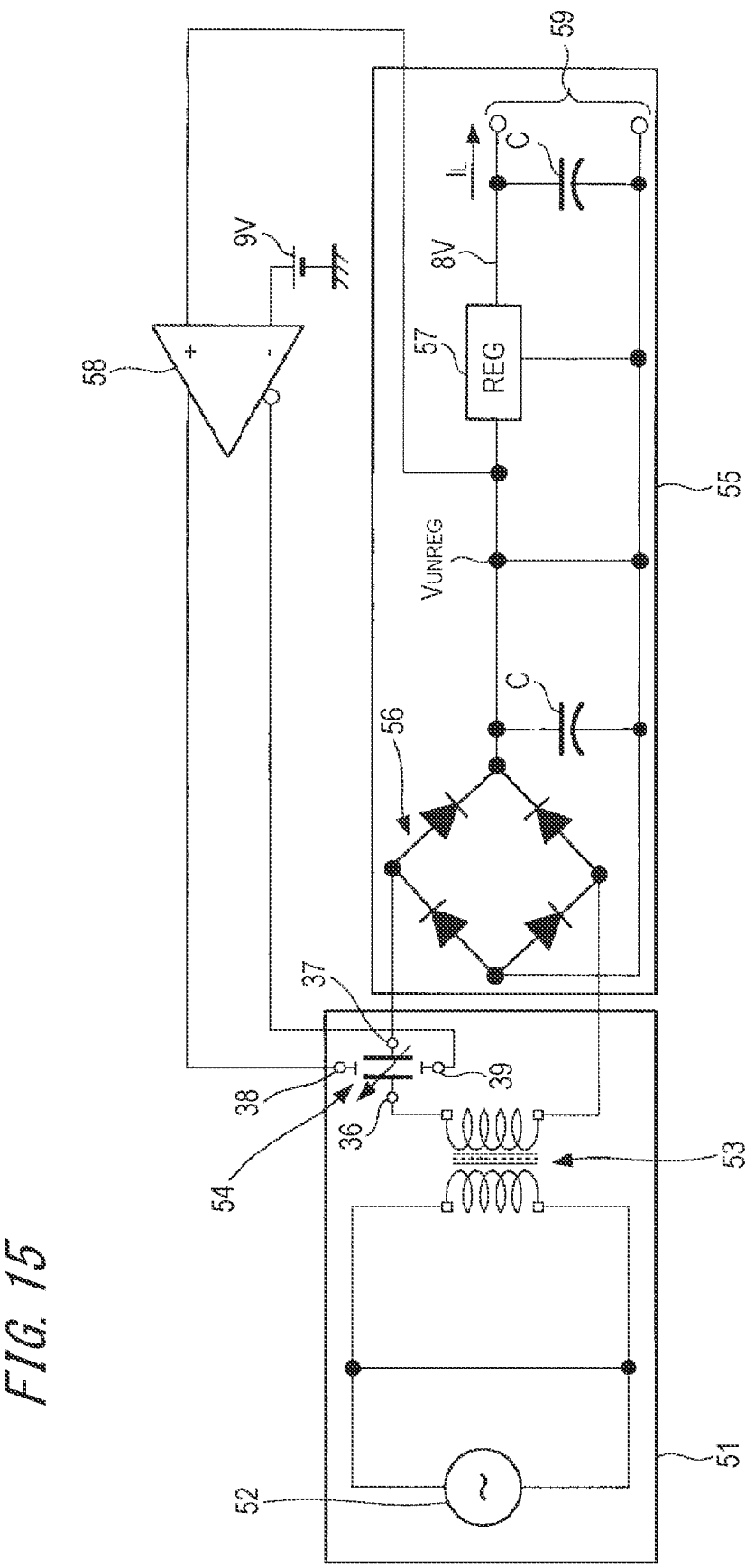
FIG. 15 It is an equivalent circuit diagram showing an example of a power supply device to which the variable capacitor of the invention is applied.

FIG. 15 shows a power supply circuit, namely, a power supply device as an example of the electronic device according to an embodiment of the invention.

The power supply device according to the embodiment is a series regulator power supply device. The power supply device according to the embodiment is configured by having a stabilizer 54 (voltage-control variable capacitor 211 in FIG. 16) including the variable capacitor according to the invention at the secondary side of a power transformer 53 in an AC circuit 51.

Figure 16:
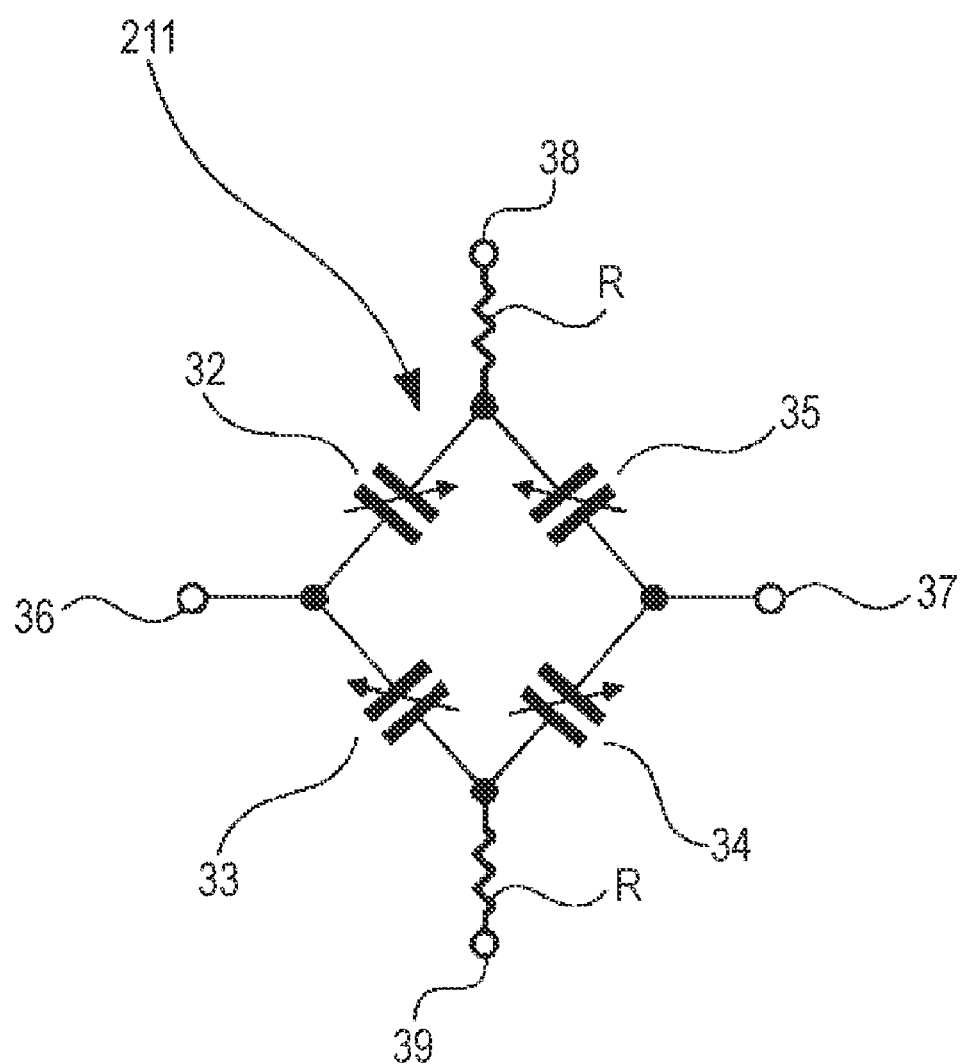
FIG. 16 It is a configuration view of a voltage-control variable capacitor used for the power supply circuit of FIG. 15.

First, the configuration of the voltage-control variable capacitor 211 will be explained. In the voltage-control variable capacitor 211, for example, four variable capacitors 32 (C1), 33 (C2), 34 (C3) and 35 (C4) are bridge-connected as shown in FIG. 16. The voltage-control variable capacitor 211 includes an AC input terminal 36 and an AC connection terminal 37 lead out at respective connection ends of one side which are opposite to each other as well as a positive (+) control terminal 38 and a negative (−) control terminal 39 led out at respective connection ends of the other side which are opposite to each other.

Operations of the voltage-control variable capacitor 211 will be explained. When an AC input voltage is supplied to the AC input terminal 36, an electric field is generated among respective electrodes of the variable capacitors 32 to 35 and AC output by a potential generated by the electric field is outputted at the AC output terminal 37. On the other hand, positive potential of the DC control signal is supplied to the control terminal 38 and negative potential of the control signal is supplied to the control terminal 39 respectively through a resistor R. When the positive potential and negative potential control signals are supplied, capacitances of respective variable capacitors 32 to 35 vary, and the capacitance of the voltage-control variable capacitor 211 varies as a whole. The AC output potential outputted from the AC output terminal 37 is controlled in accordance with the varied capacitance and the AC input potential. The voltage-control variable capacitor 211 has an operation system in which absolute values of the positive potential and negative potential control signals supplied between the control terminals 38, 39 are the same as well as reverse in polarity. Accordingly, voltage components of control signals generated at the AC input/output terminals 36, 37 are cancelled and the potential will be constantly zero there. Therefore, effects of AC input and AC output to the signals can be cancelled.

In the above power supply device, a commercial power supply 52 of AC 100V is connected between both ends of a primary coil of the power transformer 53 as an AC power supply.

The power transformer 53 is configured to reduce the commercial power supply 52 to approximately AC 9V. On end of a secondary coil of the power transformer 53 is connected to one input terminal of a rectifying circuit 56 including a diode bridge of a DC circuit 55 through the stabilizer 54 and the other end of the secondary coil is connected to the other input terminal of the rectifying circuit 56. That is, in the stabilizer 54, the AC input terminal 36 is connected at one end of the secondary coil of the power transformer 53, and the AC output terminal 37 is connected to one input terminal of the rectifying circuit 56.

The control signal input terminal (+) 38 of the stabilizer 54 is connected to a non-inversion output terminal of a differential amplifier circuit 58 including an error amplifier. The control signal input terminal (−) 39 of the stabilizer 54 is connected to an inversion output terminal of the differential amplifier circuit 58. In the example, control signals in a differential system having the same absolute value and different polarities are supplied to the control signal input terminal (+) 38 and the control signal input terminal (−) 39 of the stabilizer 54 from the non-inversion output terminal and the inversion output terminal of the differential amplifier circuit 58.

A smoothing capacitor C is connected between the one and the other output terminals of the rectifying circuit 56.

A DC voltage $V_{UNREG}$ smoothed by the rectifying circuit 56 and the smoothing capacitor C is supplied to one and the other output terminals 59 of DC voltage through a constant voltage circuit (regulator) 57 of 8V having three terminals. The smoothing capacitor C is connected between the one and the other output terminal 59.

In the example, the smoothed DC voltage $V_{UNREG}$ obtained on the output side of the rectifying circuit 56 is supplied to one input terminal of the differential amplifier circuit 58 including the error amplifier. At the same time, the other input terminal of the differential amplifier circuit 58 is grounded through a battery of a reference voltage, for example, 9V.

In the power supply device according to the embodiment, the smoothed DC voltage $V_{UNREG}$ obtained on the output side of the rectifying circuit 56 is compared with a reference voltage by the differential amplifier circuit 58. The comparison result is differentially amplified by the differential amplifier circuit 58 which can be operated with the single power supply and fed back to the control signal input terminal (+) and the control single input terminal (−) of the stabilizer 54.

The smoothed DC voltage $V_{UNREG}$ obtained on the output side of the rectifying circuit 56 is controlled to be the stabilized reference voltage 9V by the stabilizer 54.

Here, power loss in the three-terminal constant voltage circuit 57 is represented by a formula 1.

$$(V_{UNREG}-8)V \times I_L \quad \text{[Formula 1]}$$

When the stabilizer 54 is not provided, the rectified output voltage $V_{UNREG}$ varies in a rage of 9V<$V_{UNREG}$<16. The rectified output voltage $V_{UNREG}$ is converged to a range of 9V<$V_{UNREG}$<9.4V by providing with the stabilizer 54.

Therefore, the amount of loss improvement is represented by a formula 2.

$$(16-9.4)V \times I_L (I_L=0.26\text{ A}) \quad \text{[Formula 2]}$$

That is, as the power supply device in related art is not provided with the stabilizer 54 according to the embodiment, the output voltage of the power supply transformer 53 is 16V$I_L$=0.26 A at the rectified output voltage $V_{UNREG}$ when AC 100V is inputted. In this case, the design margin have to be considered, therefore, power loss PW shown by a formula 3 occurs at the maximum rating in the three-terminal constant voltage circuit 57.

$$(16-8)V \times 0.26\text{ A} = 2.08\text{ W} \quad \text{[Formula 3]}$$

On the other hand, the output side of the rectifying circuit 56 is controlled to be 9.0V by the stabilizer 54 in the embodiment, therefore, the power loss PW is represented by a formula 4 in consideration of the design margin.

$$(9.4-8)V \times 0.26\text{ A} = 0.364\text{ W} \quad \text{[Formula 4]}$$

As described above, according to the power supply device of the embodiment, significant energy saving of approximately 1.7 W can be achieved.

The invention claimed is:

1. A variable capacitor comprising:
 a ferroelectric material layer;
 a pair of electrodes sandwiching the ferroelectric material layer,
  wherein,
   a polarization processing higher than a coercive field in hysteresis characteristics of polarization by an electric field has been performed to the ferroelectric material layer, and
   the capacitance of the variable capacitor can be varied in accordance with a control voltage applied to the electrodes.

2. The variable capacitor according to claim 1, wherein the ferroelectric material layer is in an unsaturated polarization state.

3. The variable capacitor according to claim 1, wherein the capacitance varies linearly in accordance with the control voltage to be applied in a range lower than coercive fields in hysteresis characteristics of polarization by using the capacitance at a control voltage 0V as the center.

4. A control method of a variable capacitor including a ferroelectric material layer, and a pair of electrodes sandwiching the ferroelectric material layer, in which a polarization processing higher than a coercive field in hysteresis characteristics of polarization has been performed to the ferroelectric material layer, comprising a step of:
controlling a control voltage applied to the electrodes in a range of ±ΔV by using 0V as the center to control the capacitance to be varied.

5. The variable capacitor according to claim 4, wherein the control voltage is controlled on the positive side, the negative side or in a range over each of the positive and negative sides.

6. The variable capacitor according to claim 5, wherein the control voltage is controlled in a range of ±ΔV by using 0V as the center.

7. The variable capacitor according to claim 4, wherein a single polarity power supply is used and a positive/negative polarity of the control voltage is switched to change the capacitance.

8. The variable capacitor according to claim 4, wherein the capacitance resets in a range from a voltage corresponding to a depolarization electric field in which polarization is reduced to a voltage corresponding to a polarization inversion saturated electric field, and the capacitance is rewritten to control a variation amount of variation values by the magnitude of a voltage in the rewriting.

9. The variable capacitor according to claim 4, wherein a variation gradient and a variation amount of capacitance by the control voltage are controlled in accordance with the magnitude of applied voltages in the polarization processing.

10. A control method of a variable capacitor including a ferroelectric material layer and a pair of electrodes sandwiching the ferroelectric material layer and a polarization processing higher than a coercive field in hysteresis characteristics of polarization has been performed to the ferroelectric material layer, comprising a step of:
switching a positive/negative polarity of a control voltage to be applied to the electrodes to vary the capacitance by using a single polarity power supply.

11. An electronic device comprising:
a control voltage variable capacitor including a ferroelectric material layer and a pair of electrodes sandwiching the ferroelectric material layer,
wherein,
a polarization processing higher than a coercive field in hysteresis characteristics of polarization has been performed to the ferroelectric material layer, and
the capacitance varied of the variable capacitor can be varied in accordance with a control voltage applied to the electrodes.

12. A communication mobile device comprising:
a variable capacitor including a ferroelectric material layer and a pair of electrodes sandwiching the ferroelectric material layer,
wherein,
a polarization processing higher than a coercive field in hysteresis characteristics of polarization has been performed to the ferroelectric material layer, and
the capacitance of the variable capacitor is varied in accordance with a control voltage applied to the electrodes.

* * * * *